(12) United States Patent
Yamamoto et al.

(10) Patent No.: US 7,724,007 B2
(45) Date of Patent: May 25, 2010

(54) PROBE APPARATUS AND PROBING METHOD

(75) Inventors: Yasuhito Yamamoto, Nirasaki (JP); Kazuhiro Ozawa, Nirasaki (JP); Fumito Kagami, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 84 days.

(21) Appl. No.: 12/237,920

(22) Filed: Sep. 25, 2008

(65) Prior Publication Data

US 2009/0085594 A1  Apr. 2, 2009

(30) Foreign Application Priority Data

Sep. 28, 2007  (JP) .............................. 2007-256804
Mar. 31, 2008  (JP) .............................. 2008-092934

(51) Int. Cl.
*G01R 31/02* (2006.01)

(52) U.S. Cl. .................................................... 324/758
(58) Field of Classification Search ......... 324/750–758; 382/181–232; 356/614–640
See application file for complete search history.

(56) References Cited

U.S. PATENT DOCUMENTS

| | | | | |
|---|---|---|---|---|
| 5,349,735 A | * | 9/1994 | Kawase et al. | 29/407.05 |
| 5,644,245 A | * | 7/1997 | Saitoh et al. | 324/754 |
| 5,999,268 A | * | 12/1999 | Yonezawa et al. | 356/399 |
| 6,002,426 A | * | 12/1999 | Back et al. | 348/87 |
| 6,097,473 A | * | 8/2000 | Ota et al. | 355/53 |
| 6,906,546 B2 | * | 6/2005 | Tanioka et al. | 324/765 |
| 7,015,711 B2 | * | 3/2006 | Rothaug et al. | 324/758 |
| 7,297,945 B2 | * | 11/2007 | Hazaki et al. | 250/306 |
| 7,319,336 B2 | * | 1/2008 | Baur et al. | 324/751 |
| 7,463,764 B2 | * | 12/2008 | Miura et al. | 382/145 |
| 7,538,564 B2 | * | 5/2009 | Ehrmann et al. | 324/752 |
| 7,553,334 B2 | * | 6/2009 | Hazaki et al. | 850/8 |
| 7,583,099 B2 | * | 9/2009 | Kagami | 324/758 |
| 2008/0290886 A1 | * | 11/2008 | Akiyama et al. | 324/758 |
| 2009/0251163 A1 | * | 10/2009 | Yamada et al. | 324/758 |

* cited by examiner

*Primary Examiner*—Ha Tran T Nguyen
*Assistant Examiner*—Joshua Benitez
(74) *Attorney, Agent, or Firm*—Oblon, Spivak, McClelland, Maier & Neustadt, L.L.P.

(57) ABSTRACT

A probe apparatus includes an imaging unit imaging probes and a first and a second imaging unit imaging the wafer surface. The apparatus further includes a control unit obtaining positions of a mounting table at which focuses of the imaging unit and the first imaging unit are made to coincide with each other and then the focuses of the image unit and the second imaging unit are made to coincide with each other by moving the mounting table; obtaining positions of the mounting table at which the images of the wafer are sequentially taken by the first and the second imaging unit by moving the mounting table; obtaining a position of the mounting table at which the probes are imaged by the imaging unit, and calculating a position of the mounting table at which the wafer contacts with the probes based on the obtained positions of the mounting table.

13 Claims, 26 Drawing Sheets

PROBE APPARATUS AND PROBING METHOD

FIELD OF THE INVENTION

The present invention relates to a technique for measuring electrical characteristics of a target object to be inspected by bringing probes into electrical contact with electrode pads of the target object.

BACKGROUND OF THE INVENTION

After IC chips are formed on a semiconductor wafer (hereinafter, referred to as "wafer"), a probe test is performed on the wafer by using a probe apparatus in order to inspect electrical characteristics of the IC chips. The probe apparatus is configured to control a position of a wafer chuck (wafer mounting table) which is movable in X, Y and Z directions and rotatable about a Z axis so that probes, i.e., probe needles, of a probe card are brought into contact with electrode pads of the IC chips of the wafer, the probe card being provided above the wafer chuck which mounts thereon the wafer.

In order to make the probes precisely contact with the electrode pads of the IC chips on the wafer, a so-called fine alignment is performed in advance and, then, the result therefrom is used to obtain a precise location of the wafer chuck at which the probes contact with the electrode pads of the IC chips, e.g., precise coordinates of a driving system managed by a pulse encoder interlocked with a driving motor for driving the wafer chuck. Moreover, the coordinates of the driving system may be determined by optical information corresponding to the count number of pulses obtained from slits formed on linear scales provided respectively on an X stage moving in an X direction, a Y stage moving in a Y direction and a Z stage moving in a Z direction.

In order to perform the fine alignment, it is preferable to employ a configuration in which a camera is provided to have a downward view to image a wafer at a moving body moving horizontally between the wafer chuck side and a probe card and, also, a camera for taking an image of probes is provided at a wafer chuck side (see, e.g., Japanese Patent Laid-open Publication No. 2001-156127). This is because when the images of the wafer surface and the probes are taken after focuses of both cameras are aligned, the images look effectively same as the ones that the wafer surface and the probes were imaged by a single camera. Further, in order to obtain a map of chips on the wafer, it is required to perform an operation for obtaining a central position of the wafer (coordinates of a driving system of a wafer chuck) by imaging, e.g., four points in a peripheral portion of the wafer, by the camera for imaging the wafer and an operation of obtaining a orientation of the wafer by taking images of specific points on the wafer, e.g., two IC chips spaced from each other.

After the orientation of the wafer is adjusted, specific points on the wafer are imaged and, then, the position of the wafer chuck (a so-called contact position) at which the electrode pads of the IC chips contact with the probes is obtained with high accuracy based on the imaging result. In order to perform the fine alignment, the moving body is positioned at a preset location and, then, the wafer chuck is moved so that each point on the wafer can be imaged sequentially by the camera for imaging the wafer. However, to image a large number of points, a total period of time required for moving the wafer chuck increases. Besides, since the movement region of the wafer chuck is large, the probe apparatus main body needs to be designed at a dimension capable of covering the movement region, thus scaling up the apparatus. Especially, as the wafer is scaled up, there is expected a wafer having a dimension greater than 12 inches. Therefore, if the number of probe apparatuses to be installed increases, a large occupation area is required. However, if a region of the clean room is restricted, it is not possible to increase the number of probe apparatuses to be installed.

SUMMARY OF THE INVENTION

In view of the above, the present invention provides a miniaturized probe apparatus capable of providing a high throughput.

In accordance with an embodiment of the present invention, there is provided a probe apparatus for inspecting a plurality of chips arranged on a wafer, by contacting probes of a probe card with electrode pads of the chips while mounting on a mounting table the wafer, the mounting table being horizontally and vertically movable by a mounting table driving unit.

The probe apparatus includes an imaging unit provided at the mounting table and having an upward view to image the probes; a moving body movable horizontally at a height position within a range between the mounting table and the probe card; a first and a second imaging unit of which optical axes are spaced from each other, provided at the moving body and having a downward view to take an image of a surface of the wafer.

The probe apparatus further includes a control unit obtaining respective positions of the mounting table at which a focus of the imaging unit for imaging the probes and a focus of the first imaging unit for imaging the wafer are made to coincide with each other and then the focus of the imaging unit for imaging the probes and the second imaging unit for imaging the wafer are made to coincide with each other by moving the mounting table; obtaining respective positions of the mounting table at which the images of the wafer on the mounting table are sequentially taken by the first and the second imaging unit for imaging the wafer by moving the mounting table; obtaining a position of the mounting table at which the image of the probes is taken by the imaging unit for imaging the probes; and calculating a position of the mounting table at which the wafer contacts with the probes based on the obtained positions of the mounting table.

The probe apparatus may further includes a first and a second low magnification camera of which optical axes are spaced from each other, provided at the moving body and having a downward view to image the wafer at a magnification lower than those of the first and the second imaging unit.

A pair of the first imaging unit and the first low magnification camera and a pair of the second imaging unit and the second low magnification camera are preferably arranged symmetrically.

Preferably, two points on a peripheral portion of the wafer are sequentially imaged by the first and the second low magnification camera; after the mounting table is moved in a direction perpendicular to a line connecting the optical axes of the first and the second low magnification camera, other two points on an opposite peripheral portion of the wafer are sequentially imaged by the first and the second low magnification camera; and a central position of the wafer is obtained based on the positions of the mounting table at which the four points of the wafer are imaged.

Further, the two points on the peripheral portion of the wafer mounted on the mounting table and the other two points on the opposite peripheral portion may be imaged by the first and the second imaging unit for imaging the wafer instead of the first and the second low magnification camera for imaging the wafer.

The mounting table may be rotated to make the wafer positioned in a predetermined direction based on positions of the mounting table at which two specific points spaced from each other on the wafer are sequentially imaged by the first and the second imaging unit for imaging the wafer.

The first and the second imaging unit for imaging the wafer are preferably provided at the moving body such that they are movable toward and away from each other by a driving unit for the imaging unit.

The control unit may output a control signal to the driving unit for the imaging unit so that a distance between the optical axes of the first and the second imaging unit becomes equal to a distance between the two specific points on the wafer based on information corresponding to the type of the wafer.

In accordance with another embodiment of the present invention, there is provided a probing method for inspecting a plurality of chips arranged on a wafer, by contacting probes of a probe card with electrode pads of the chips while mounting on a mounting table the wafer, the mounting table being horizontally and vertically movable by a mounting table driving unit.

The probing method includes by using an imaging unit provided at the mounting table and having an upward view to image the probes and a first and a second imaging unit of which optical axes are spaced from each other, provided at a moving body moving horizontally at a height position within a range between the mounting table and the probe card and having a downward view to image a surface of the wafer, obtaining respective positions of the mounting table at which a focus of the imaging unit for imaging the probes and a focus of the first imaging unit for imaging the wafer are made to coincide with each other and then the focus of the imaging unit for imaging the probes and a focus of the second imaging unit for imaging the wafer are made to coincide with each other.

The probing method further includes obtaining respective positions of the mounting table at which the images of the wafer on the mounting table are sequentially taken by the first and the second imaging unit for imaging the wafer by moving the mounting table; obtaining a position of the mounting table at which the image of the probes is taken by the imaging unit for imaging the probes; and calculating a position of the mounting table for contacting the wafer and the probes based on the obtained positions of the mounting table.

In the probing method, obtaining the positions of the mounting table at which the images of the wafer mounted on the mounting table are sequentially taken by the first and the second imaging unit for imaging the wafer may includes: sequentially imaging two points on a peripheral portion of the wafer by the first and the second imaging unit; after moving the mounting table in a direction perpendicular to a line connecting the optical axes of the first and the second imaging unit, sequentially imaging other two points on an opposite peripheral portion of the wafer by the first and the second imaging unit; and obtaining a central position of the wafer based on the positions of the mounting table at which the four points of the wafer are imaged.

The probing method may further includes rotating the mounting table to make the wafer positioned in a predetermined direction based on positions of the mounting table at which two specific points spaced from each other on the wafer are sequentially imaged by the first and the second imaging unit for imaging the wafer.

The probing method may further includes adjusting the positions of the first and the second imaging unit by a driving unit for the imaging unit so that a distance between the optical axes of the first and the second imaging unit becomes equal to a distance between the two specific points on the wafer based on information corresponding to the type of the wafer.

In accordance with still another embodiment of the present invention, there is provided a storage medium storing a computer-executable program used in a probe apparatus for inspecting a plurality of chips arranged on a substrate by mounting the substrate on a mounting table that is horizontally and vertically movable by a mounting table driving unit, and then contacting probes of a probe card with electrode pads of the chips. The computer program performs the probing method described above.

In the present invention, the first and the second imaging unit of which optical axes are spaced from each other are provided at the moving body moving horizontally at the height position between the wafer mounting table and the probe card and have a downward view to image the wafer surface. Thus, when the image of the wafer is taken to obtain position information of the wafer, the movement of the wafer mounting table can be reduced. Accordingly, the apparatus can be scaled down, and a period of time required to obtain the position information of the wafer can be decreased, thereby obtaining a high throughput. Moreover, the first and the second imaging unit for taking an image of the wafer are provided to be approached to and spaced from each other, so that the separated distance therebetween can be adjusted to correspond to that between two specific points on the wafer. Therefore, if the wafer mounting table moves to the position at which a single specific point is imaged, the other specific point can be imaged in a state without moving the wafer mounting table. As a consequence, a higher throughput can be obtained.

BRIEF DESCRIPTION OF THE DRAWINGS

The above and other objects and features of the present invention will become apparent from the following description of embodiments, given in conjunction with the accompanying drawings, in which.

DETAILED DESCRIPTION OF THE EMBODIMENT

Hereinafter, embodiments of the present invention will be described in detail with reference to the accompanying drawings.

Figure 1:
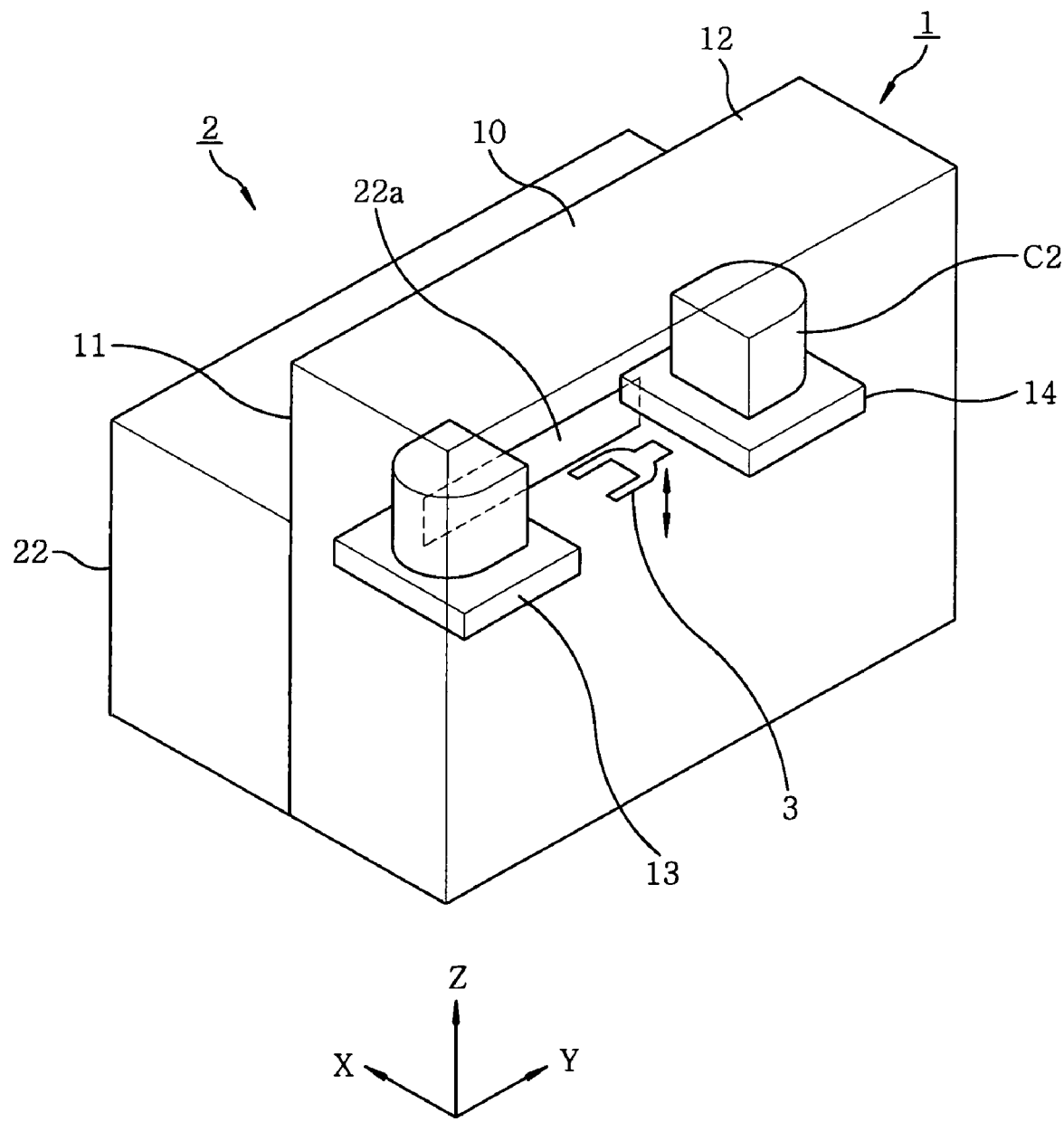
FIG. 1 is a general perspective view of an example of a probe apparatus in accordance with a first embodiment of the present invention.
Figure 2:
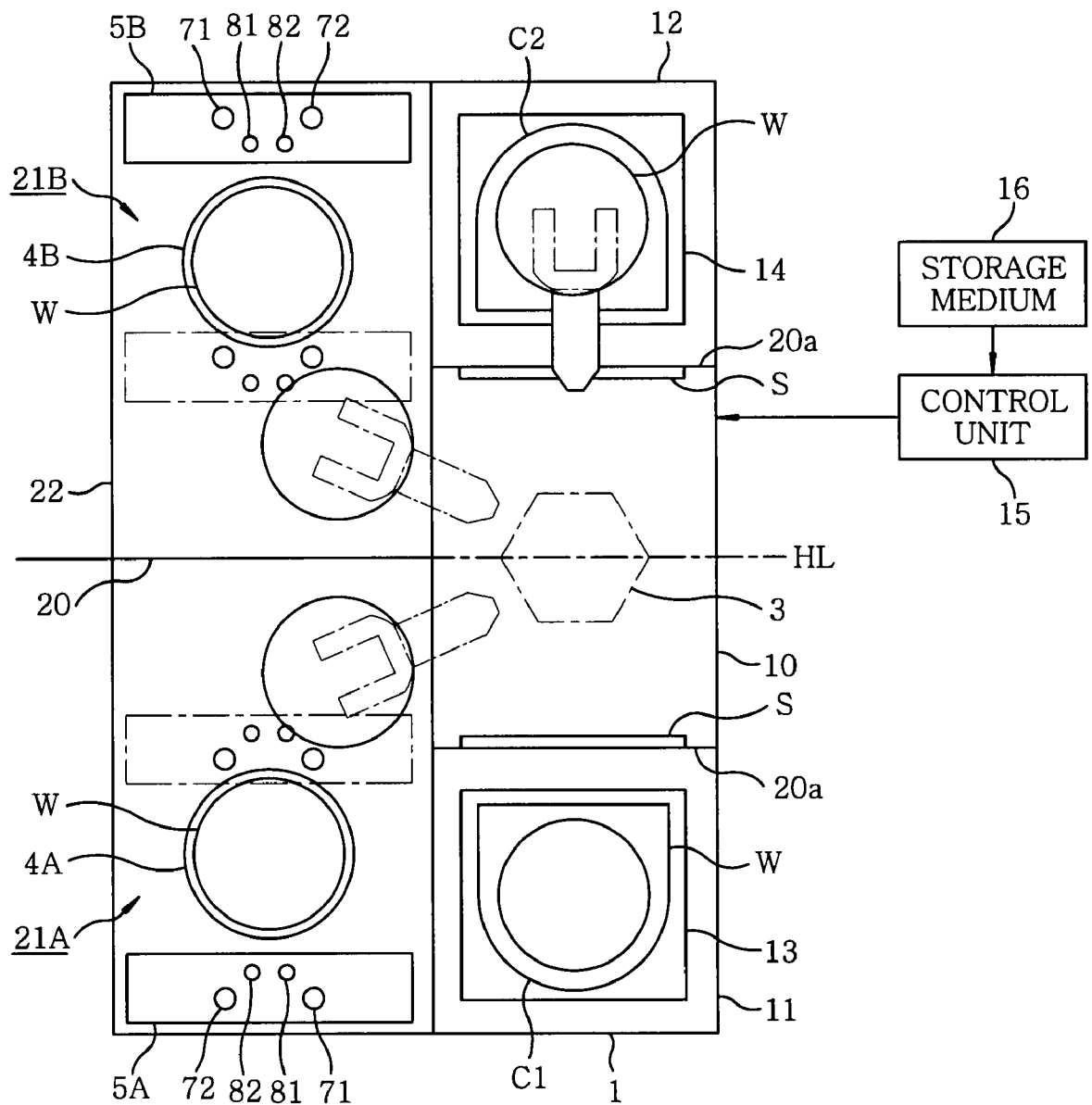
FIG. 2 describes a schematic top plan view of the example of the probe apparatus.
Figure 3:
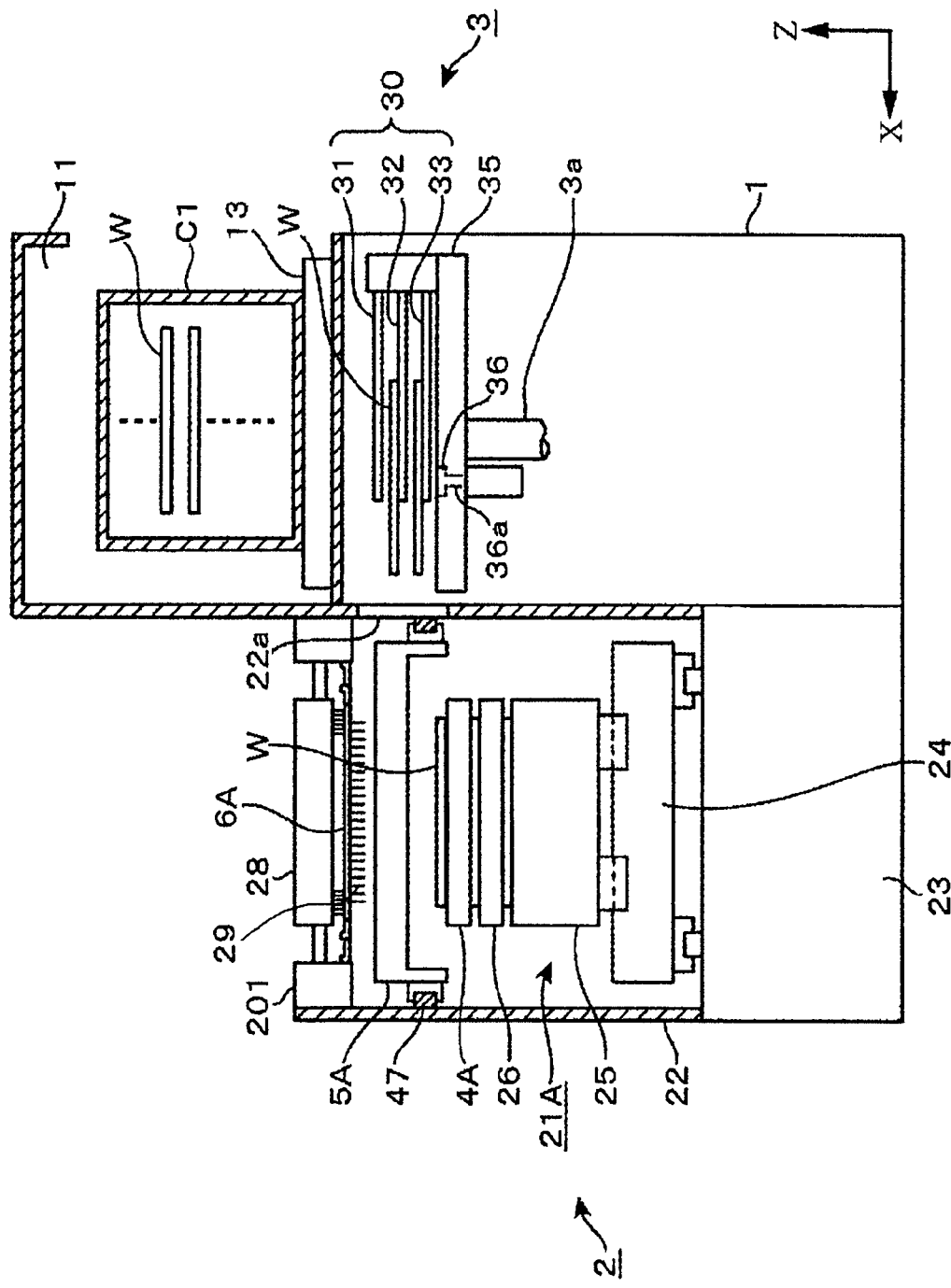
FIG. 3 provides a vertical cross sectional view of the example of the probe apparatus.

As illustrated in FIGS. 1 to 3, a probe apparatus in accordance with a first embodiment of the present invention includes: a loader unit 1 for transferring a wafer W as a substrate having thereon a plurality of chips to be inspected; and a probe apparatus main body 2 for probing the wafer W. Above all, entire layout of the loader unit 1 and the probe apparatus main body 2 will be described briefly.

The loader unit 1 has a first and a second loading port 11 and 12 for loading a first and a second carrier C1 and C2 as transfer containers accommodating therein a plurality of wafers W and a transfer chamber 10 provided between the first and the second loading port 11 and 12. The first and the second loading port 11 and 12 have a first and a second mounting table 13 and 14 spaced from each other in a Y direction, and the first and the second mounting table 13 and 14 mount thereon the carriers C1 and C2 so that transfer openings (front openings) thereof can face each other. Further, the transfer chamber 10 is provided with a wafer transfer mechanism (substrate transfer mechanism) 3 which transfers the wafer W by using an arm 30 as a substrate supporting member.

The probe apparatus main body 2 has a housing 22 forming a casing of the probe apparatus main body 2. The housing 22 is provided near the loader unit 1 in an X direction, and is divided into two sections in the Y direction via a partition wall 20. The two sections correspond to casings of a first and a second inspection unit 21A and 21B. The first inspection unit 21A has a wafer chuck 4A as a substrate mounting table, an alignment bridge 5A serving as an imaging unit having a camera moving in the Y direction (the direction of connecting the loading ports 11 and 12) above the wafer chuck 4A, and a probe card 6A provided in a head plate 201 forming a ceiling portion of the housing 22. The second inspection unit 21B has the same configuration which includes a wafer chuck 4B, an alignment bridge 5B and a probe card 6B.

Figure 4:
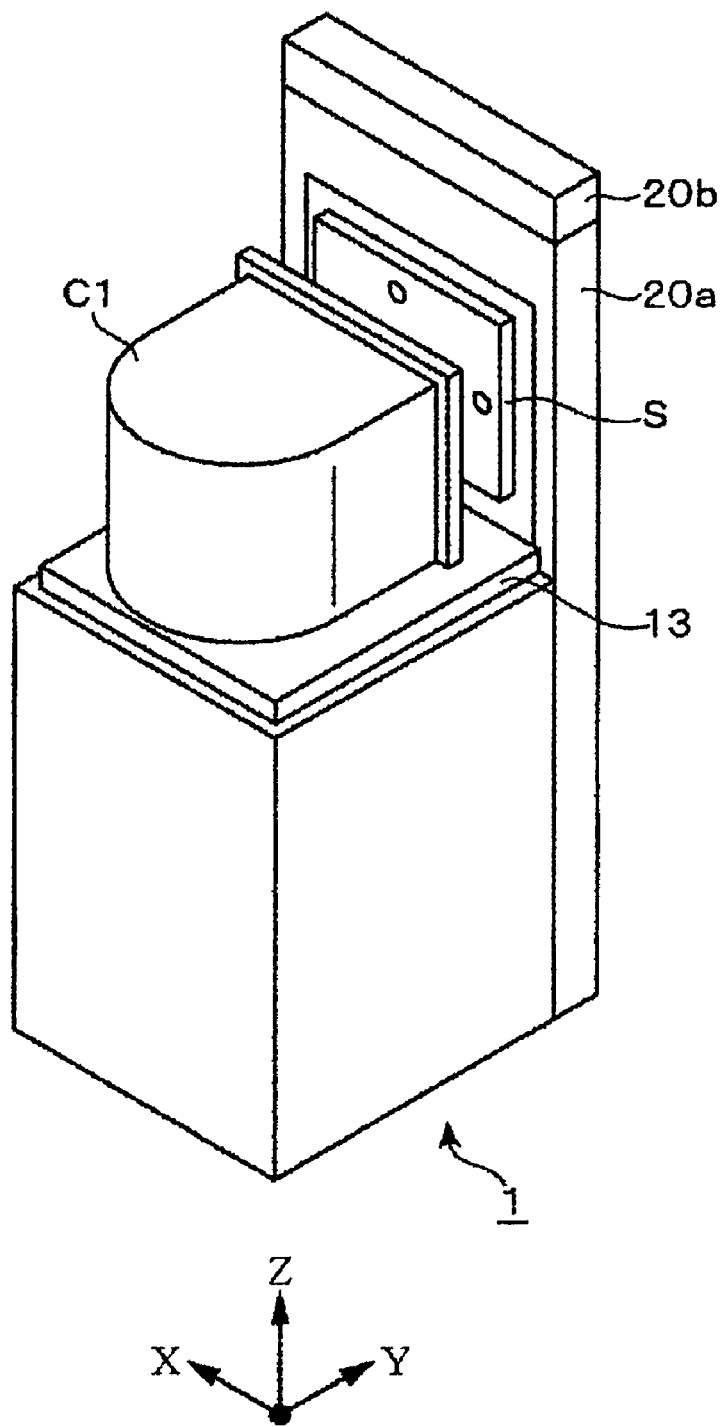
FIG. 4 presents a perspective view of an example of a loading port in the probe apparatus.

Hereinafter, the loader unit 1 will be described. Since the first and the second loading port 11 and 12 are symmetrically arranged and have a same configuration, the configuration of the first loading port 11 is representatively described in FIG. 4. As shown in FIGS. 3 and 4, the loader unit 1 is partitioned from the transfer chamber 10 by a partition wall 20a, and the partition wall 20a is provided with a shutter S and an opening/closing mechanism 20b for opening and closing the shutter S and the transfer opening of the first carrier C1. Moreover, the first mounting table 13 is configured to rotate by an interval of 90° in a clockwise direction and a counterclockwise direction by a rotation mechanism (not shown) positioned therebelow.

Namely, when the airtight carrier C1 called a FOUP (Front Opening Unified Pod) is mounted on the first mounting table 13 from the front side of the probe apparatus (right side of the X direction) by an automatic guided vehicle (AGV) (not shown) in a clean room in a state where the front opening of the carrier C1 faces the probe apparatus (left side of the X direction), the first mounting table 13 rotates by an angle of 90° in the clockwise direction so that the opening can face the shutter S. Meanwhile, when the first carrier C1 is unloaded from the first mounting table 13, the first carrier C1 rotates by an angle of 90° in the counterclockwise direction.

The wafer W is transferred between the first carrier C1 and the wafer transfer mechanism 3 by moving back and forth the wafer transfer mechanism 3 with respect to the first carrier C1. At this time, the first carrier C1 communicates with the transfer chamber 10 by opening the shutter S and the transfer opening of the first carrier C1 with the use of the opening/closing mechanism 20b in a state where the opening of the first carrier C1 faces the shutter S.

The wafer transfer mechanism 3 includes a transfer base 35, a rotation axis 3a for rotating the transfer base 35 about a vertical axis, and a lift mechanism (not shown) for vertically moving the rotation axis 3a. The transfer base 35 has three arms 30, and each of the arms 30 can independently be controlled to move back and forth to transfer the wafer W. The rotation center of the rotation axis 3a is positioned between the first and the second carrier C1 and C2. That is, the rotation center is spaced apart at the same distance from the first and the second carrier C1 and C2. Further, the wafer transfer mechanism 3 can move vertically between an upper position where the wafer W is transferred between the first and the second carrier C1 and C2 and a lower position where the wafer W is transferred between the first and the second inspection unit 21A and 21B.

Figure 5A:
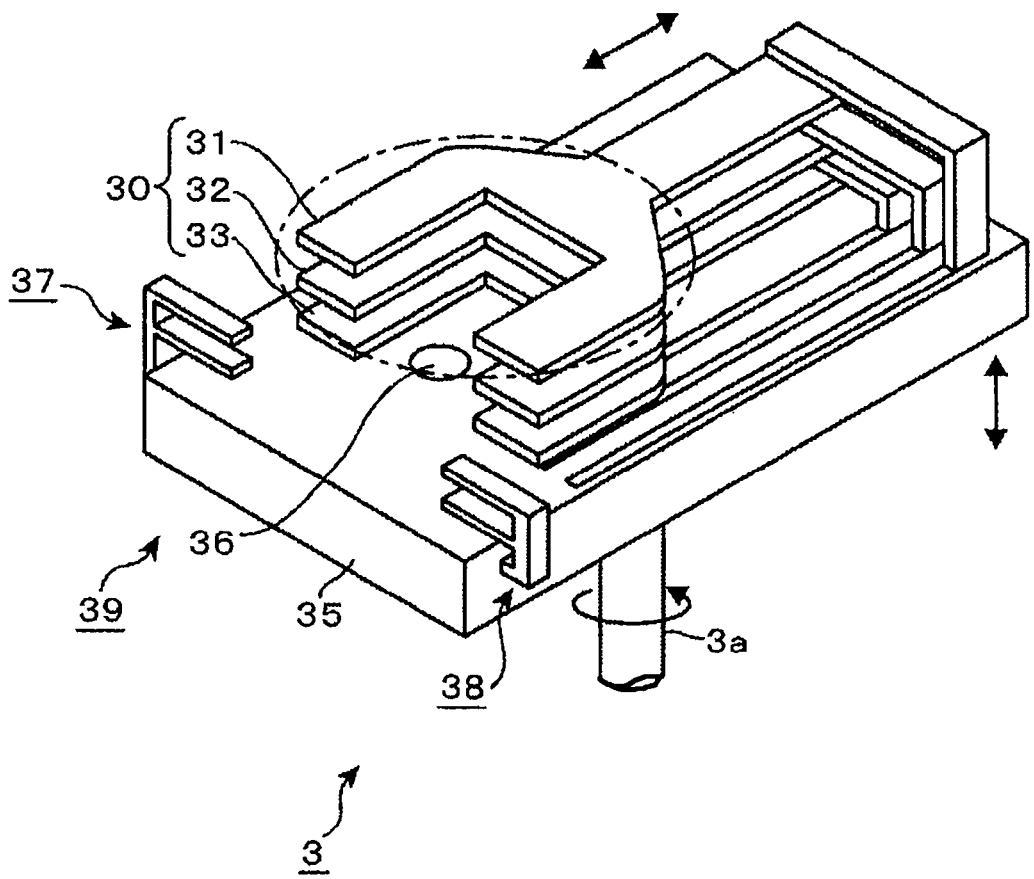
FIGS. 5A and 5B show schematic views of an example of a wafer transfer mechanism in the probe apparatus.
Figure 5B:
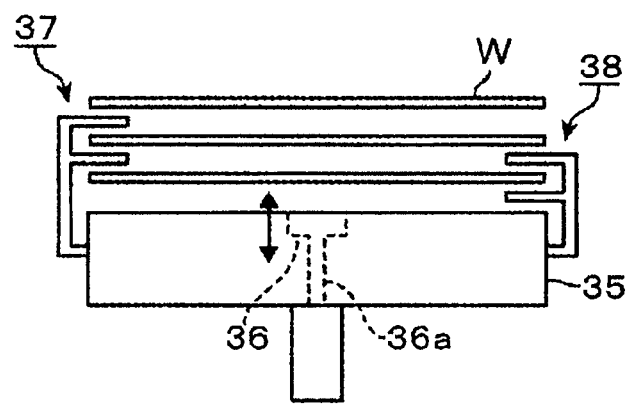

Moreover, referring to FIGS. 5A and 5B, the wafer transfer mechanism 3 includes a pre-alignment mechanism 39 for pre-aligning the wafer W. The pre-alignment mechanism 39 has an axis 36a that freely rotates and vertically moves up and down through the transfer base 35 and a chuck portion 36 provided on top of the axis 36a and serving as a rotation stage. Under normal circumstances, the chuck portion 36 is engaged into a recess formed in the surface of the transfer base 35 to form a same plane with the surface of the transfer base 35. The chuck portion 36 is located at a position corresponding to a central position of a wafer on one of the arms 30, which are moved back to a middle of a movement route, and serves to lift the wafer W slightly off the arm and rotate it.

Further, the pre-alignment mechanism 39 includes optical sensors 37 and 38 which serve together as a detection unit having a light emitting sensor and a light receiving sensor for detecting a circumference of the wafer W rotated by the chuck portion 36. The optical sensors 37 and 38 are fixed to the transfer base 35 while being deviated from the movement region of the arms 30. In this example, the wafers W on a lower and a middle arm 33 and 32 will be pre-aligned, so that the optical sensors 37 and 38 are positioned above and below the peripheral portions of the wafers W and the height of the optical sensors 37 and 38 are set to avoid the contact with the wafers W during an access to the wafers W. Although it is not shown, the loader unit 1 further includes a controller for detecting a central position of the wafer W and a direction reference such as notches or orientation flats of the wafer W based on signals from the optical sensors 37 and 38 and then rotating the chuck portion 36 based on the detection result so that the notches or the like can face a predetermined direction.

The following is a brief description of a process for adjusting (pre-aligning) an orientation of the wafer W mounted on the lower arm 33 by the pre-alignment mechanism 39 including the optical sensors 37 and 38 and the chuck portion 36. First of all, the wafer W on the lower arm 33 is slightly lifted and rotated by the chuck portion 36 and, at the same time, light is emitted from a light emitting portion of the optical sensor 38 toward a light receiving portion via an area including a circumferential portion (edge portion) of the wafer W. Next, the chuck portion 36 stops in a state where the wafer W is positioned in a predetermined orientation on the lower arm 33. Then, the chuck portion 36 is lowered, and the wafer W is transferred on the lower arm 33. As a consequence, the orientation of the wafer W is adjusted. Thereafter, when the wafer W is mounted on the wafer chuck 4A of the first inspection unit 21A, the position of the wafer transfer mechanism 3 is adjusted to correct the eccentricity of the wafer W. As a result, the orientation and the eccentricity of the wafer W are adjusted. The optical sensors 37 and 38 are not illustrated in FIG. 3.

Figure 6:
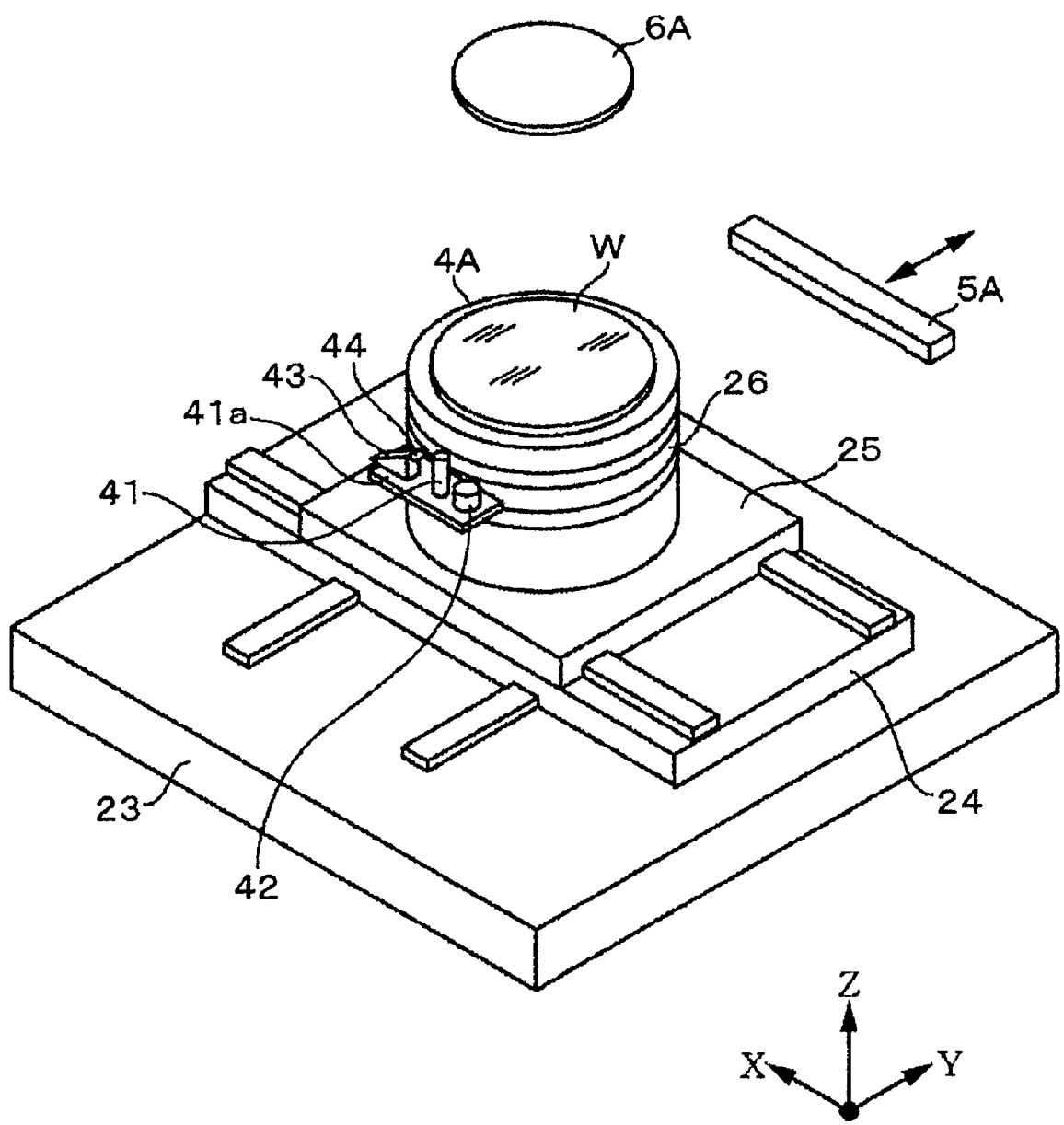
FIG. 6 offers a perspective view of an example of an inspection unit in the probe apparatus.

Hereinafter, the probe apparatus main body 2 will be described. In the housing 22 of the probe apparatus main body 2, a strip-shaped transfer opening 22a extending in a horizontal direction (Y direction) opens in a sidewall of the loader unit 1 side, to thereby transfer the wafer W from/to the first inspection unit 21A or the second inspection unit 21B. In the first and the second inspection unit 21A and 21B, the positions for transferring wafers W, the positions for imaging surfaces of the wafers W and the positions for installing the respective probe cards 6A and 6B are symmetrical with respect to a horizontal line HL perpendicular to a straight line connecting the first and the second loading port 11 and 12 via the rotation center of the wafer transfer mechanism 3. Since the first and the second inspection unit 21A and 21B have the same configuration, the first inspection unit 21A will be representatively described with reference to FIGS. 3, 6 and 7 in order to omit the redundant description.

The inspection unit 21A has a base 23. Further, a Y stage 24 and an X stage 25 are provided on the base 23 in that order. The Y stage 24 is driven in the Y direction by, e.g., a ball screw or the like, along a guide rail extending in the Y direction, and the X stage 25 is driven in the X direction by, e.g., a ball screw, along a guide rail extending in the X direction. Although it is not shown, the X stage 25 and the Y stage 24 have motors combined with encoders.

Provided on the X stage 25 is a Z moving unit 26 moving in a Z direction by a motor combined with an encoder (not shown). The Z moving unit 26 has a wafer chuck 4A serving as a substrate mounting table capable of rotating about a Z-axis (moving in a θ direction), so that the wafer chuck 4A can move in X, Y, Z and θ directions. A driving unit is formed by the X stage 25, the Y stage 24 and the Z moving unit 26, and is constructed to move the wafer chuck 4A among the transfer positions for transferring the wafer W with respect to the wafer transfer mechanism 3, the imaging positions on the surface of the wafer W and the contact positions (inspection positions) of the probe needles 29 of the probe card 6A, as will be described later.

The probe card 6A is detachably adhered to the head plate 201 above the movement region of the wafer chuck 4A. The probe card 6A has on a top surface thereof an electrode group. Further, a pogo pin unit 28 having on a bottom surface thereof a plurality of pogo pins 28a as an electrode unit positioned corresponding to the electrode group of the probe card 6A is provided above the probe card 6A to electrically connect the electrode group and the test head (not shown). Generally, the test head (not shown) is positioned on the top surface of the pogo pin unit 28. In this example, however, the test head is separately provided from the probe apparatus main body 2, and is connected with the pogo pin unit 28 via a cable (not illustrated).

The probes are provided on the entire bottom surface of the probe card 6A. The probes, i.e., vertical needles (wire probe needles) are electrically connected with the electrode group of the top surface of the probe card 6A and extend vertically with respect to the surface of the wafer W to correspond to the arrangement of the electrode pads of the wafer W. As for the probes, there may be used the probe needles 29 made of a metal wire extending downward slantingly with respect to the surface of the wafer W, a gold bump electrode formed on a flexible film or the like. The probe card 6A in this example is configured to make a contact with all the electrode pads of the chips to be inspected (IC chips) on the wafer surface at a time, so that the electrical characteristics can be measured by a single contact operation.

A micro camera 41 having an upward view, i.e., an imaging unit for imaging the probe needles 29, is fixed via a fixing plate 41a to a side portion of the Z moving unit 26, the side portion facing toward the partition wall 20 of the wafer chuck 4A. The micro camera 41 is formed as a high magnification camera having a CCD camera so that an enlarged view of a needle tip of a probe needle 29 or an alignment mark of the probe card 6A can be obtained. Moreover, the micro camera 41 is positioned substantially at the center point in the X direction of the wafer chuck 4A. In order to check the arrangement and the positions of the probe needles 29 during the alignment, the micro camera 41 images specific probe needles 29, e.g., the probe needles 29 positioned at both ends of the X and Y directions. Further, in order to monitor the states of the probe needles 29 regularly, the micro camera 41 images all the probe needles 29 sequentially.

Figure 7A:
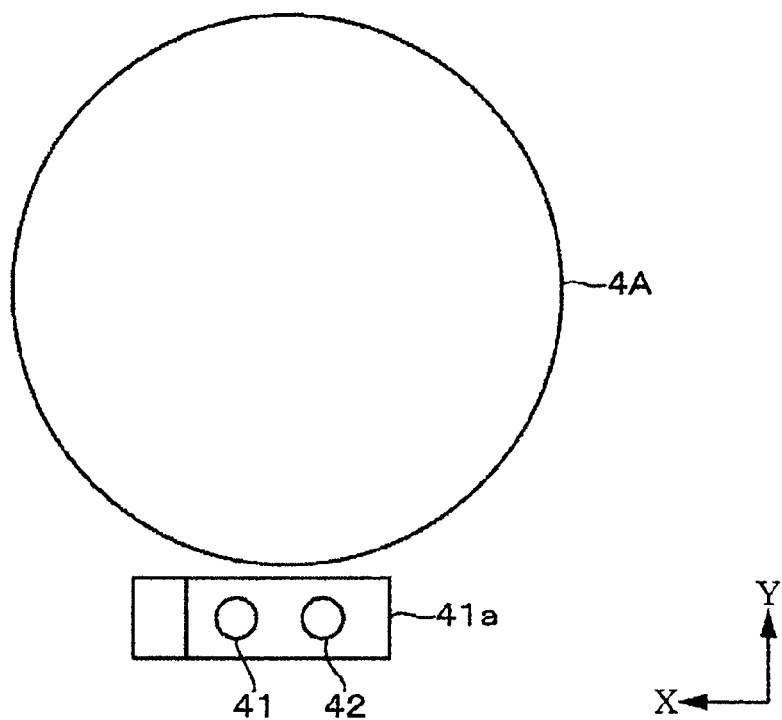
FIGS. 7A and 7B show schematic views of the example of the inspection unit.
Figure 7B:
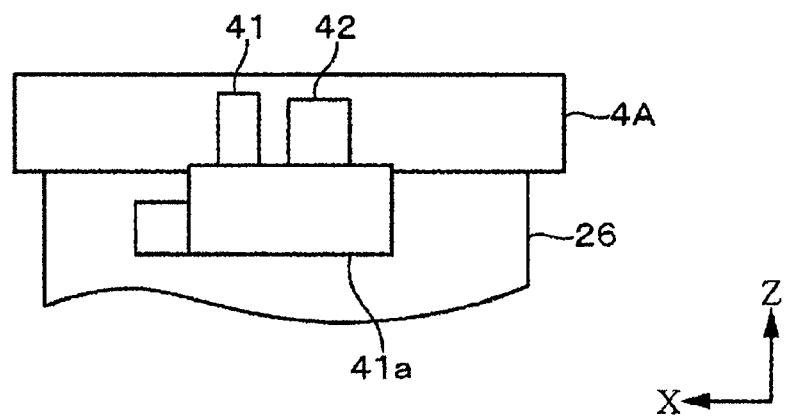

A micro camera 42 as a low magnification camera for imaging the arrangement of the probe needles 29 in a wide area is fixed to the fixing plate 41a near the micro camera 41. In addition, a target 44 is provided on the fixing plate 41a so that it can move back and forth by a reciprocating mechanism 43 in a direction perpendicular to an optical axis with respect to an in-focus surface of the micro camera 41. The target 44 can be recognized through an image by the micro camera 41 and a micro camera 45 to be described later. Moreover, the target 44 has a structure that a circular metallic film as a subject for alignment, e.g., a metallic film having a diameter of about 140 micron, is deposited on, e.g., a transparent glass plate. FIGS. 7A and 7B provide a top view and a side view schematically describing a positional relationship between the wafer chuck 4A and the micro cameras 41 and 42. The target 44 or the reciprocating mechanism 43 is omitted in FIGS. 7A and 7B.

Figure 8:
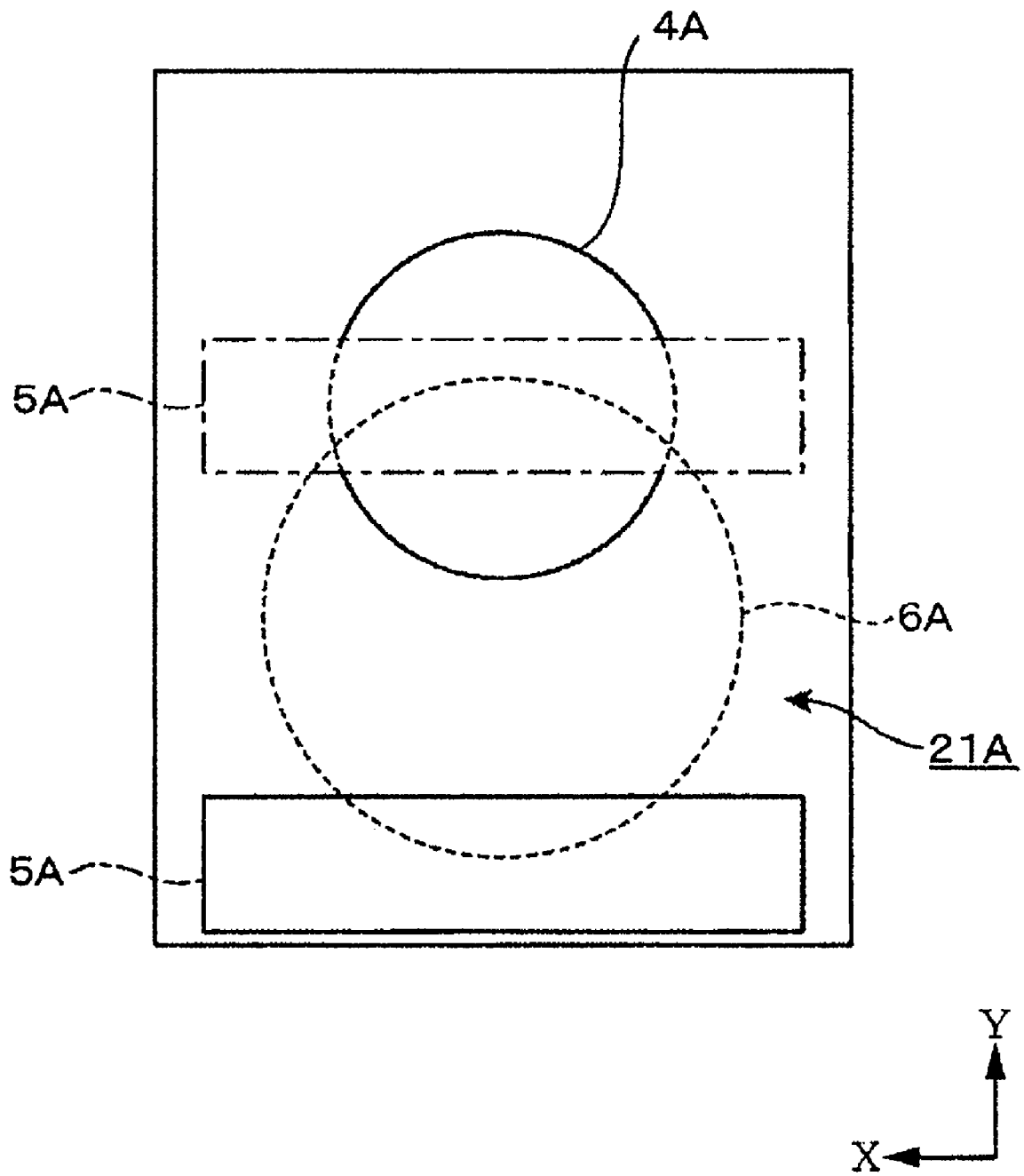
FIG. 8 is a top view illustrating a position of an alignment bridge in the inspection unit.

Guide rails 47 are provided along the Y direction on both sides (front side and inner side) in the X direction of an inner wall surface of the housing 22 between the wafer chuck 4A and the probe card 6A. As illustrated in FIG. 8, the alignment bridge 5A as an imaging unit can move in the Y direction along the guide rail 47 between a reference position to be described later and the imaging position.

Figure 9:
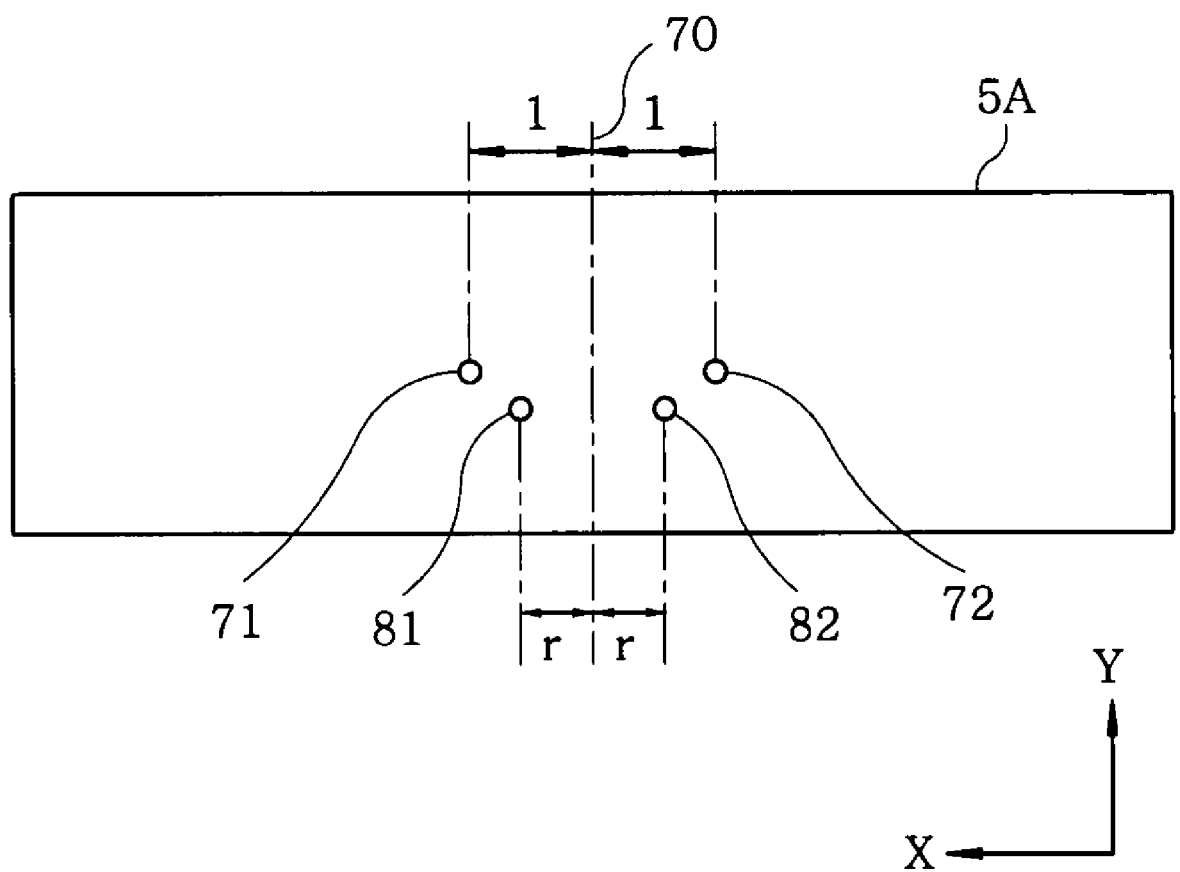
FIG. 9 depicts a top plan view of an alignment bridge in accordance with an embodiment of the present invention.

Hereinafter, the X direction (see FIG. 2) indicates a right and left direction, for convenience. As illustrated in FIG. 9, in the alignment bridge 5A, a first micro camera 71 and a second micro camera 72 are provided symmetrically with respect to a central line 70 dividing the alignment bridge 5A into a right part and a left part and, also, a first macro camera 81 and a second macro camera 82 are provided symmetrically with respect to the central line 70. The first micro camera 71 and the second micro camera 72 correspond to a first imaging unit and a second imaging unit, respectively. The first macro camera 81 and the second macro camera 82 correspond to a first low magnification camera and a second low magnification camera, respectively.

Each of the above cameras has a downward view. Here, the micro camera (or the macro camera) has an optical system having a camera main body 71a (72a) and mirror 71b (72b) shown in FIGS. 16A and 16B which will be described later. A key technical point of the present invention is the micro camera (or the macro camera) having the optical axis extending downward from the bottom surface of the alignment bridge 5A. For convenience, the micro camera stands for an imaging window formed on the bottom surface of the alignment bridge 5A or the optical system having the camera main body and the mirror. In FIG. 9, small circular portions referred to as micro cameras (and macro cameras) stand for imaging windows, and this will be applied to the following drawings.

Further, the image taken by each of the micro cameras 71 and 72 (or macro cameras 81 and 82) is image-processed in a control unit which will be described later. The macro cameras 81 and 82 are positioned closer to a horizontal line HL as a boundary between the first inspection unit 21A and the second inspection unit 21B, compared to the micro cameras 71 and 72, as shown in FIG. 2. Moreover, when the wafer has a size (dimension) of about 300 mm, a distance l between each of the micro cameras 71 and 72 and the central line 70 is about 73 mm; and a distance r between each of the macro cameras 81 and 82 and the central line 70 is about 45 mm. Furthermore, distances between the cameras and other units are measured by setting the optical axes of the cameras as measuring points, respectively. For example, the distance l between one of the micro cameras 71 and 72 and the central line 70 means the distance between the optical axis of the corresponding one of the micro cameras 71 and 72 and the central line 70.

Each of the micro cameras 71 and 72 is formed as a high magnification camera including a CCD camera so that the enlarged view of the wafer surface can be obtained. Meanwhile, each of the macro cameras 81 and 82 is formed as a low magnification camera for widely capturing the wafer W.

A reference position corresponding to the stop position of the alignment bridge 5A is a position at which the alignment bridge 5A retreats to avoid the contact with the wafer chuck 4A or the wafer transfer mechanism 3 when the wafer W is transferred between the wafer chuck 4A and the wafer transfer mechanism 3, when the wafer W is brought into contact with the probe card 6A and when the probe needles 29 are imaged by the first imaging unit (micro camera 41). Moreover, the imaging position is a position obtained when the surface of the wafer W is imaged by the macro cameras 81 and 82 and the micro cameras 71 and 72 of the alignment bridge 5A. The surface of the wafer W is imaged by the micro cameras 71 and 72 and the macro cameras 81 and 82 while moving the wafer chuck 4A in a state where the alignment bridge 5A is fixed to the imaging position.

Figure 10:
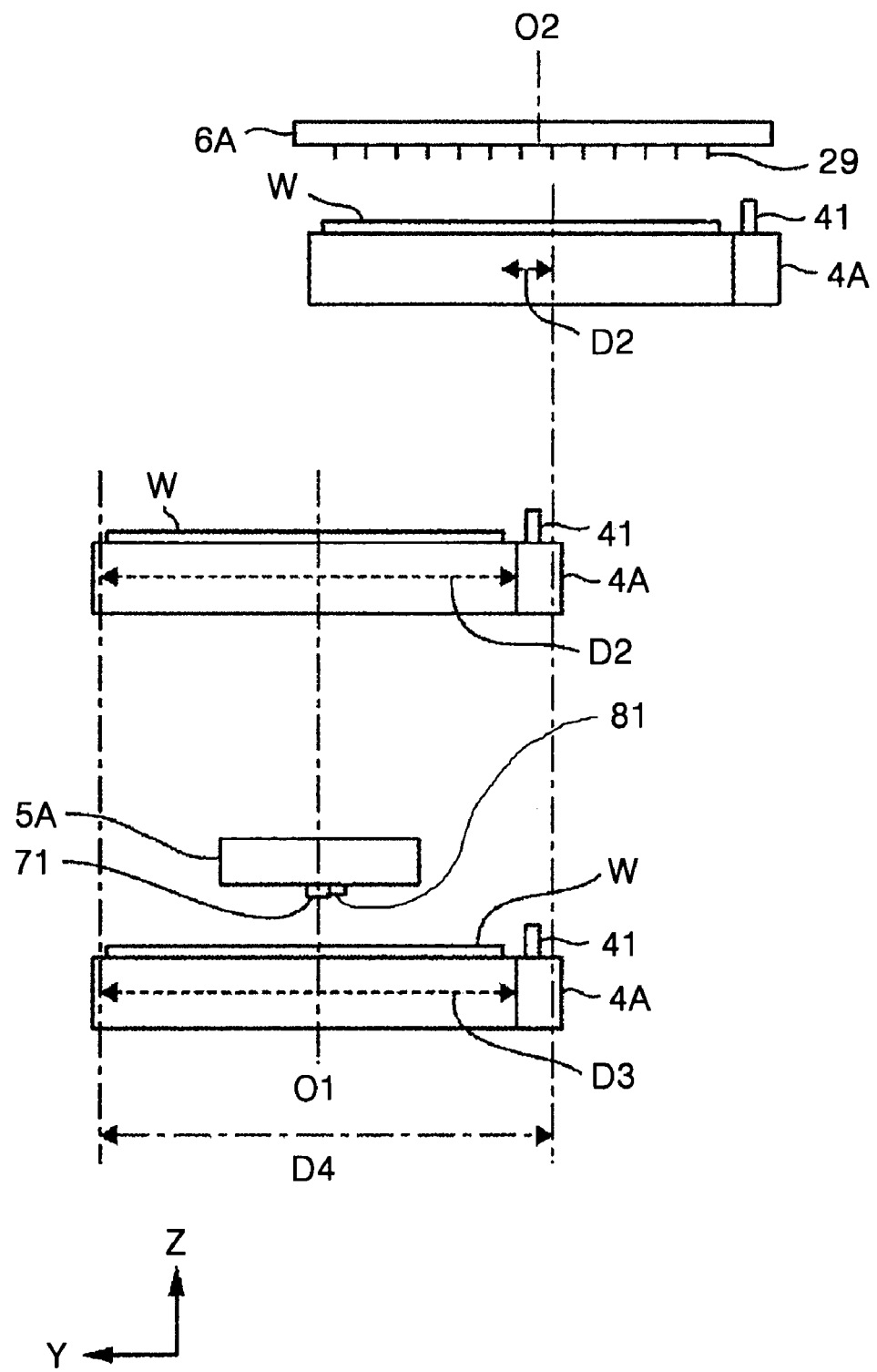
FIG. 10 provides a schematic view of an example of a movement stroke of a wafer chuck in the inspection unit.

As can be seen from a lower portion of FIG. 10, the imaging position is deviated toward an inner side of the Y direction (toward the center of the probe apparatus main body 2) with respect to the central position of the probe card 6A. The reason thereof will be described as follows.

As set forth above, when the probe needles 29 are imaged by the micro camera 41 provided on a side surface of the wafer chuck 4A (front side of the Y-axis direction), a movement stroke D2 in the Y-axis direction of the wafer chuck 4A (a movement stroke of a central position O1 of the wafer chuck 4A) is deviated toward the partition wall 20 side of the Y-axis direction with respect to a central position O2 of the probe card 6A, as shown in a middle portion of FIG. 10. Meanwhile, as illustrated in an upper diagram of FIG. 10, a movement stroke D1 of the wafer chuck 4A at which the wafer W contacts with the probe needles 29 is short, because a plurality of probe needles 29 is formed on the bottom surface of the probe card 6A, so that the probe needles 29 are brought into contact with the wafer W at a time.

Accordingly, when the imaging position of the alignment bridge 5A is aligned with the central position O2 of the probe card 6A, a movement stroke D3 of the wafer chuck 4A at which the surface of the wafer W is imaged by the micro camera 45 is deviated toward the right side of the movement stroke D1.

Therefore, the imaging position of the alignment bridge 5A is made to be biased toward the partition wall 20 side of the Y-axis direction so that the movement strokes D2 and D3 are overlapped with each other, thereby shortening a driving stroke (movable range) D4 including the movement strokes D1 to D3 of the wafer chuck 4A, i.e., a distance in the Y-axis direction of the probe apparatus main body 2. The movement strokes D2 and D3 may not be the same as long as the imaging position of the alignment bridge 5A is deviated toward the partition wall 20 side of the Y-axis direction with respect to the central position O2 of the probe card 6A.

As shown in FIG. 2, the probe apparatus includes a control unit 15 which is, e.g., a computer. The control unit 15 has a data processing unit formed of a program, a memory, a CPU or the like. The program has multiple steps for controlling a series of operations of each unit which includes loading of the carrier C into the loading port 11 or 12, inspecting the wafer W, returning the wafer W to the carrier C and unloading the carrier C. Further, the program (including a program for manipulating input or displaying) is stored in a storage medium 16, e.g., a flexible disk, a compact disk, an MO (magneto-optical) disk, a hard disk or the like, and is installed in the control unit 15.

Figure 11:
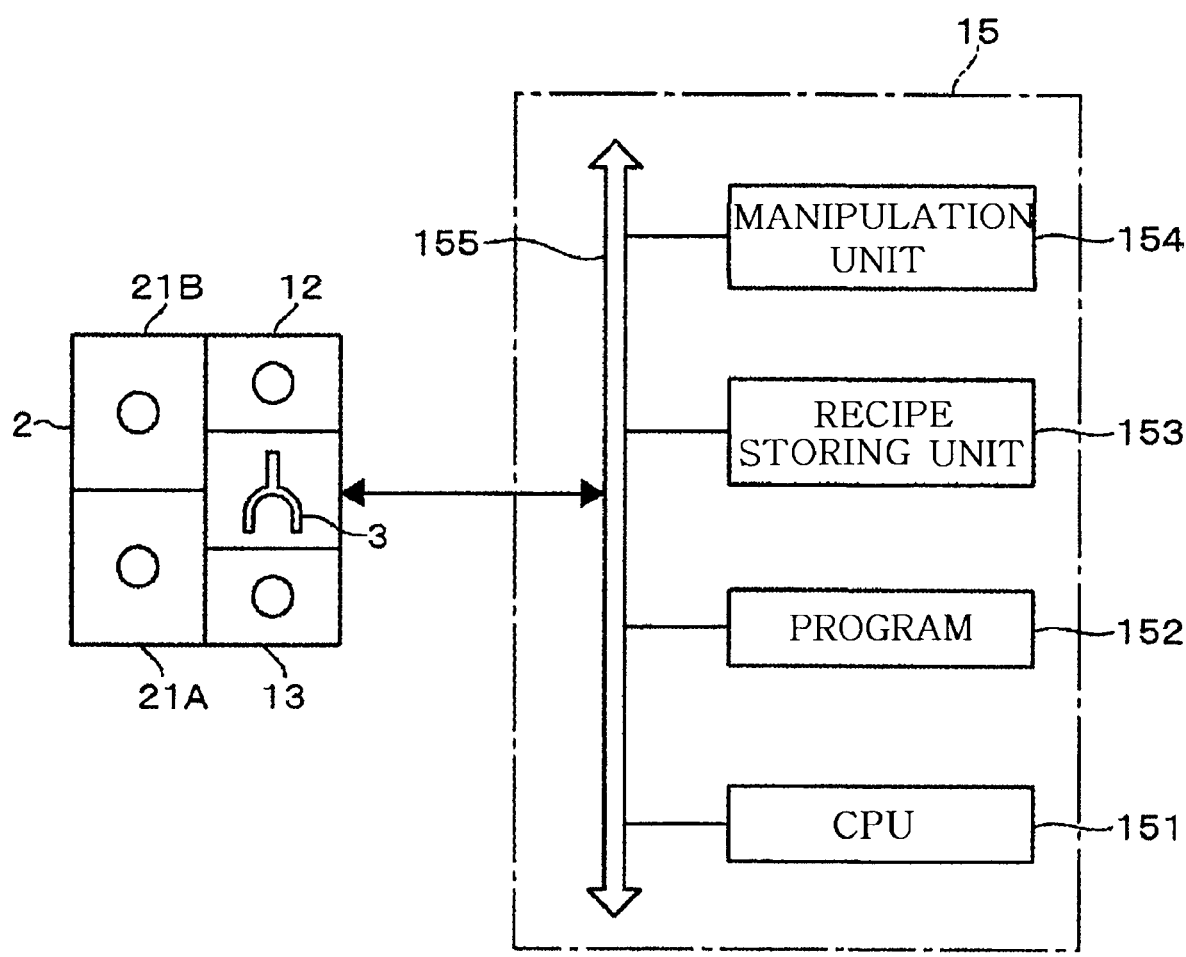
FIG. 11 illustrates a configuration example of a control unit used in the embodiment of the present invention.

FIG. 11 shows an example of the configuration of the control unit 15 illustrated in FIG. 2. Reference numeral 151 indicates a CPU; reference numeral 152 indicates a program for executing a series of processes of the probe apparatus; reference numeral 153 indicates a recipe storing unit for storing recipes of the inspection performed in the inspection units 21A and 21B; reference numeral 154 indicates a manipulation unit for performing an operation or setting an operation mode or parameters of the probe apparatus; and reference numeral 155 represents a bus. The manipulation unit 154 has a display such as a touch panel or the like.

Hereinafter, the operation of the probe apparatus will be described. First of all, the carrier C is loaded from the opposite side of the probe apparatus main body 2 into the loading port 11 or 12 by the AGV in a clean room. At this time, the transfer opening of the carrier C faces the probe apparatus main body 2. However, the transfer opening of the carrier C is made to face the shutter S by rotating the mounting table 13 or 14. Next, the mounting table 13 moves forward, so that the carrier C is pushed toward the shutter S. As a result, the lid of the carrier C and the shutter S are separated.

Thereafter, the wafer W is unloaded from the carrier C, and is transferred to the inspection unit 21A or 21B. Since the two wafers W1 and W2 are already inspected by the first and the second inspection unit 21A and 21B, the process for unloading next wafers W3 and W4 from the carrier C will be described hereinafter.

Figure 12:
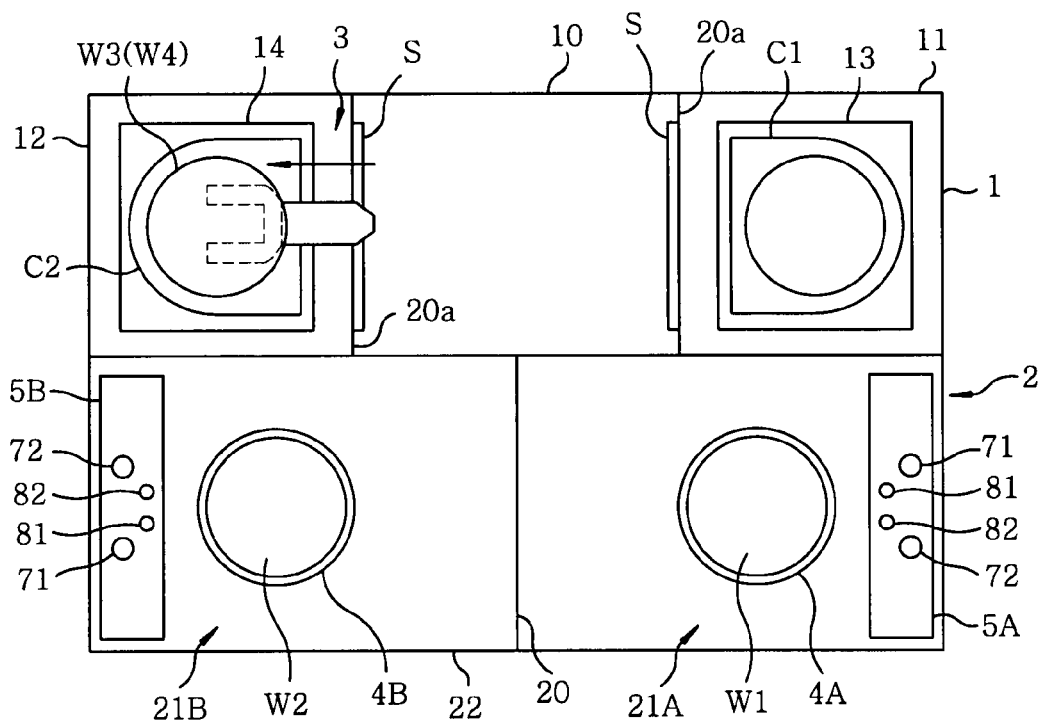
FIG. 12 presents a top plan view of an exemplary operation of the probe apparatus.
Figure 13:
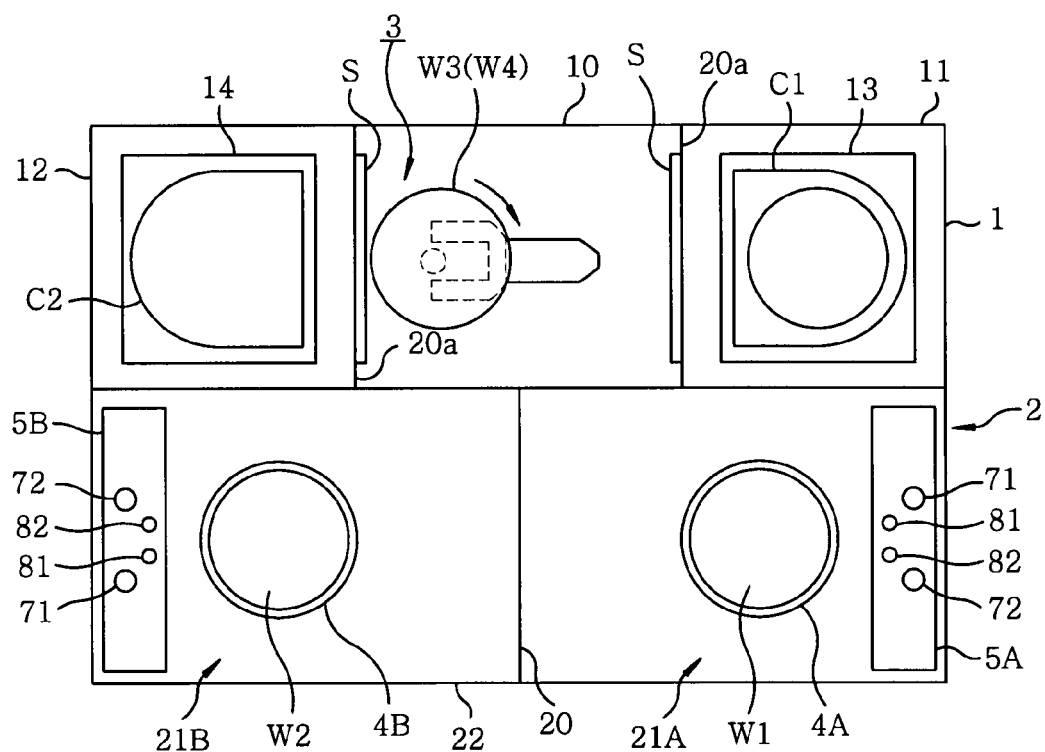
FIG. 13 shows a top plan view of an exemplary operation of the probe apparatus.

Above all, the middle arm 32 moves into the second carrier C2 to receive the wafer W3, and then is retreated to a position for pre-alignment, as described in FIG. 12. Next, pre-alignment is performed. That is, the chuck portion 36 moves up to raise the wafer W3 and rotate, whereby the notch direction of the wafer W3 is controlled to correspond to the first or second inspection unit where the wafer W3 will be inserted based on the detection result of the optical sensor 37. During the pre-alignment, eccentricity of the wafer W3 is also detected. Then, as shown in FIG. 13, the lower arm 33 moves into the second carrier C2 to receive the wafer W4 as shown in FIG. 13. In that state, the notch direction of the wafer W4 is controlled to correspond to the first or second inspection unit where the wafer W4 will be inserted and the eccentricity of the wafer W4 is detected. Thereafter, the wafer transfer mechanism 3 is lowered to replace the wafers W3 and W4 with the wafers W1 and W2.

Figure 14:
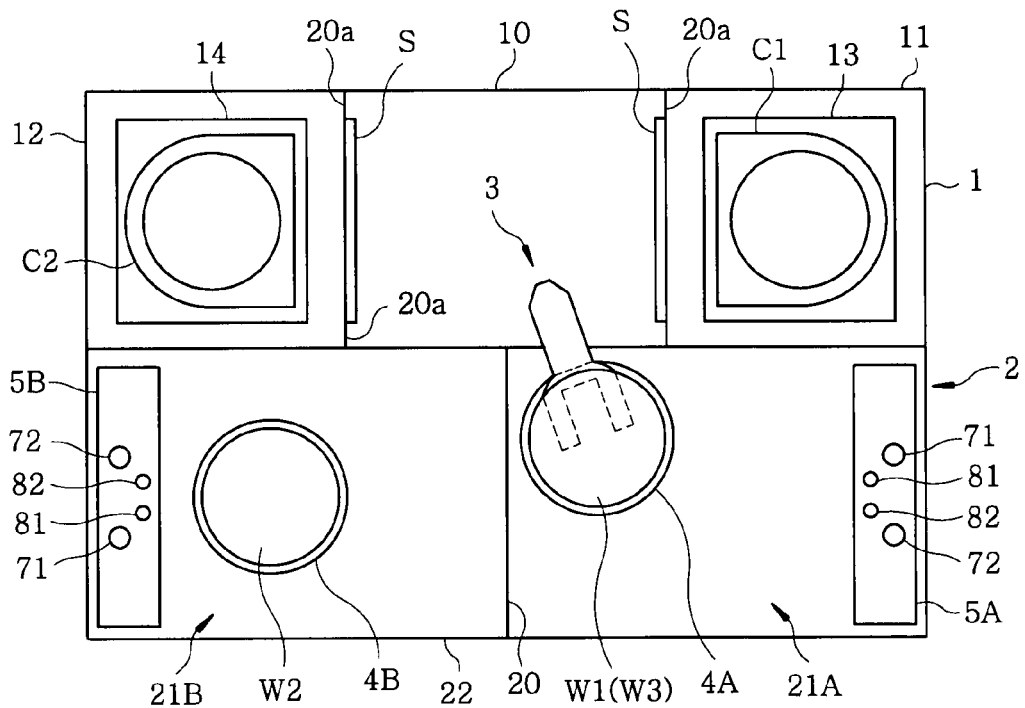
FIG. 14 describes a top plan view of the exemplary operation of the probe apparatus.

Next, the wafer W1 in the first inspection unit 21A is replaced with the wafer W3 mounted on the wafer transfer mechanism 3. If the inspection of the wafer W1 is completed, the wafer chuck 4A moves to the transfer position near the partition wall 20, as can be seen from FIG. 14. Thereafter, the vacuum chuck of the wafer chuck 4A is released, and the lift pin in the wafer chuck 4A is moved up to raise the wafer W1. When the empty upper arm 31 moves onto the wafer chuck 4A, the lift pin is lowered and, then, the upper arm 31 receives the wafer W1 and retreats. Next, the wafer transfer mechanism 3 is slightly raised, and the middle arm 32 moves onto the wafer chuck 4A. If it is determined that the central position of the wafer W3 is deviated in the pre-alignment, the wafer W3 is mounted on the wafer chuck 4A by the cooperation of the lift pin (not shown) and the middle arm 32 so that the eccentricity of the wafer W3 can be corrected.

Figure 15:
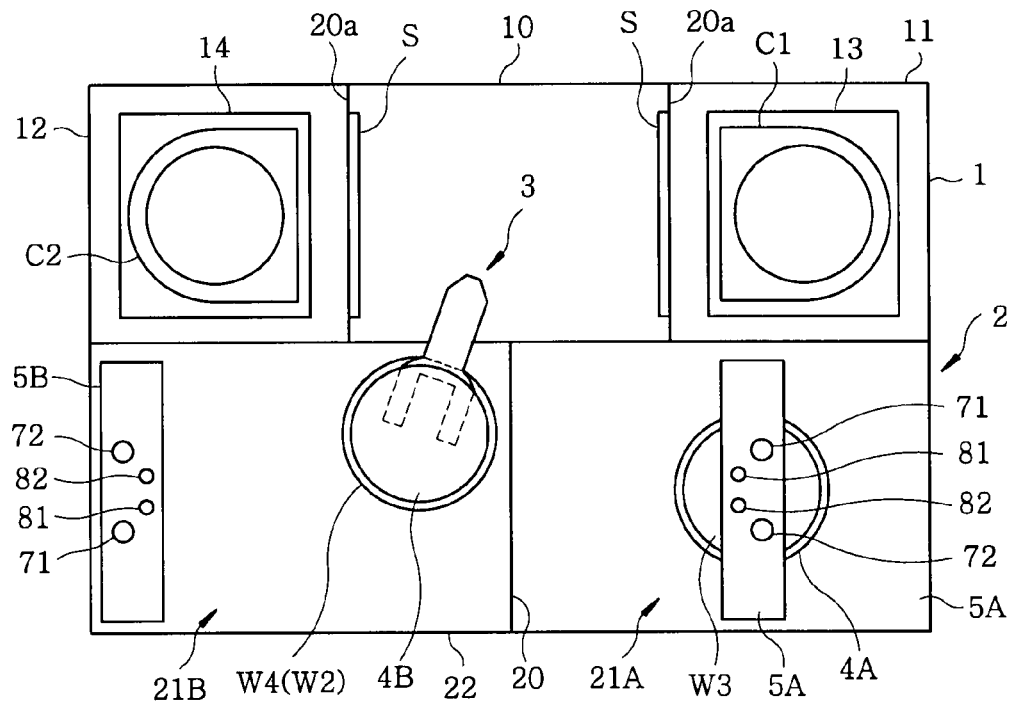
FIG. 15 shows a top plan view of the exemplary operation of the probe apparatus.

Thereafter, as shown in FIG. 15, the middle arm 32 that has become empty after the wafer W3 is transferred to the first inspection unit 21A moves into the second inspection unit 21B. Next, the middle arm 32 receives the wafer W2 inspected on the wafer chuck 4B and retreats. Thereafter, the lower arm 33 moves onto the wafer chuck 4B, and the wafer W4 to be inspected is transferred from the lower arm 33 to the wafer chuck 4B.

Next, the wafer transfer mechanism 3 is raised, and the wafers W1 and W2 are returned to, e.g., the first carrier C1. Besides, next wafers W5 and W6 are unloaded from the carrier C to be subjected to the same processes.

Meanwhile, in the first inspection unit 21A, after the wafer W3 is transferred to the wafer chuck 4A, the probe needles 29 of the probe card 6A are imaged by the micro camera 41 provided at the wafer chuck 4A. That is, the tips of the probe needles are positioned at the center of the view field of the micro camera 41, i.e., a center of the cross mark, and position coordinates (X, Y, Z coordinates) of the driving system of the wafer chuck 4A are obtained. To be specific, the probe needles 29 positioned at both ends of the X direction and those positioned at both ends of the Y direction are imaged, thereby checking the center of the probe card 6A and the arrangement of the probe needles 29. In this case, the tip positions of the target probe needles 29 in a region near a target position which is determined by the micro camera 42 are detected by the micro camera 41. At this time, the alignment bridge 5A is retreated to the reference position depicted in FIG. 8.

Figure 16A:
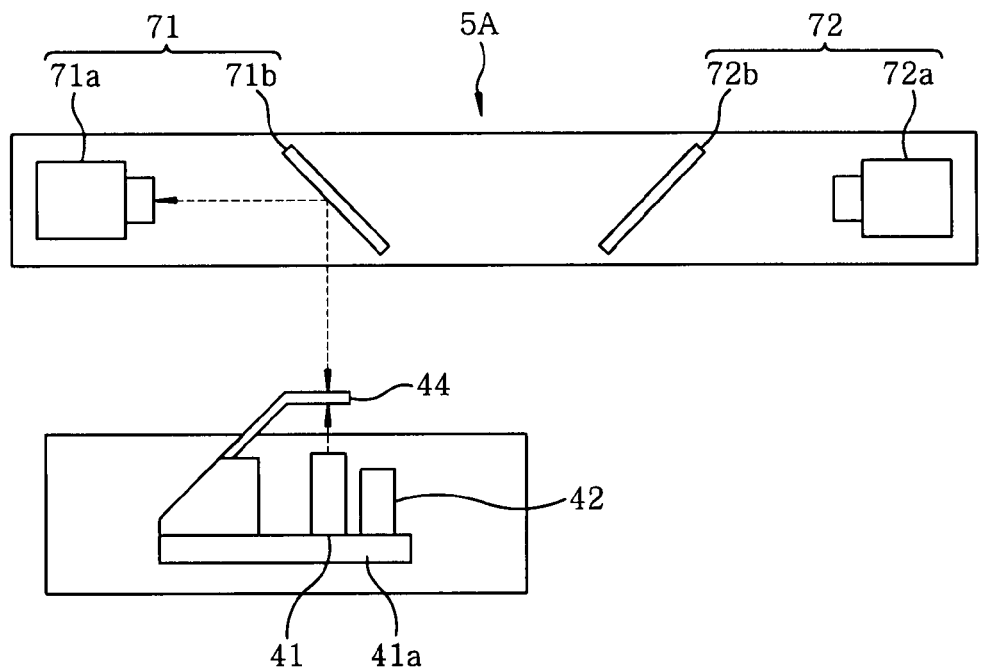
FIGS. 16A and 16B explain processes for obtaining original points of both cameras.
Figure 16B:
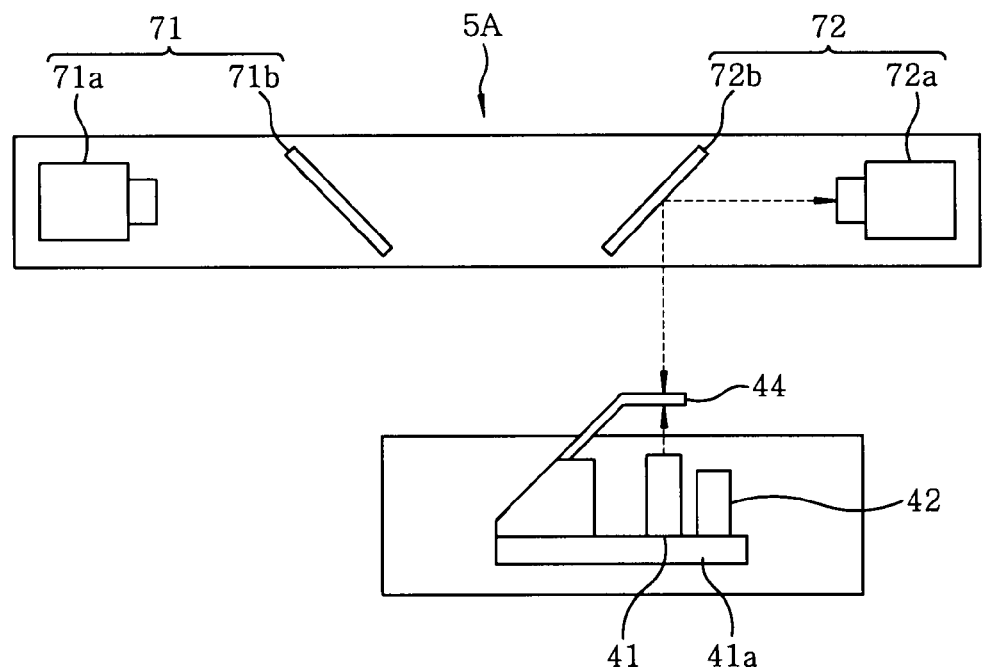

Next, the alignment bridge 5A moves to the imaging position of the wafer W3 (see FIG. 8) and, at the same time, the target 44 is made to project to an area between the micro camera 41 of the wafer chuck 4A and the first micro camera 71 of the alignment bridge 5A, as illustrated in FIG. 16A. Thereafter, the position of the wafer chuck 4A is adjusted so that the focuses and the optical axes of the micro cameras 41 and 71 coincide with the target mark of the target 44. As a result, the original points of the micro cameras 41 and 71 are obtained. In the same manner, the original point of the second micro camera 72 is regained, as shown in FIG. 16B. The X,Y, Z coordinates of the driving system of the wafer chuck 4A are stored, at the time when the original point of the micro cameras 41 and 71 and that of the cameras 41 and 72 are regained, are stored. Next, the target 44 is retreated, and the wafer chuck 4A is positioned below the alignment bridge 5A. In that state, the fine alignment is performed as will be described hereinafter.

Figure 17:
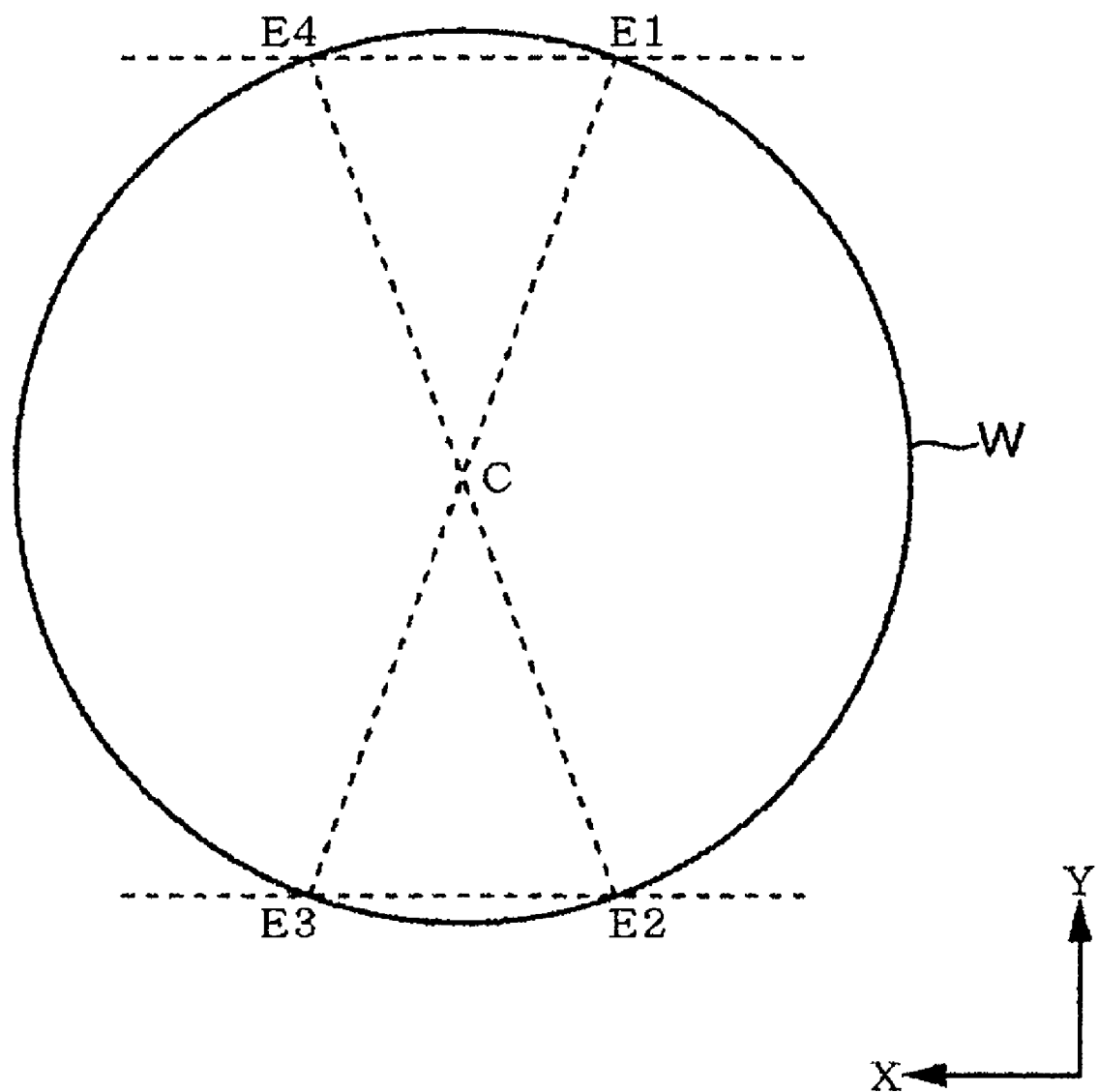
FIG. 17 explains a method of using the micro camera of the alignment bridge.

First of all, the central position of the wafer W is obtained by using the macro cameras 81 and 82. Referring to FIG. 17, the coordinates of four points E1 to E4 in the periphery of the wafer W are obtained by taking images of the four points E1 to E4 and, also, an intersection point between a line connecting two points E2 and E4 and a line connecting two points E1 and E3 is obtained. In this case, the position of the wafer chuck 4A is adjusted so that the peripheral edge of the wafer W is positioned on the center of the view field of each of the first and the second macro camera 81 and 82 for example, on the center of the cross mark.

After the images of the points E2 and E3 are taken, the wafer W is moved in a direction perpendicular to the line connecting the centers of the view fields to take the images of the points E1 and E4. As a consequence, the intersection point between the two straight lines corresponds to coordinates of the center C of the wafer W. As described above, the optical point of the first micro camera 71 of the alignment bridge 5A and the micro camera 41 of the wafer chuck 4A and that of the second micro camera 72 of the alignment bridge 5A side and the micro camera 41 regain respective original coordinates. Further, since the distance between the optical axes of the first and the second micro camera 71 and 72 and that between the optical axes of the first and the second macro camera 81 and 82 are already known, the relative coordinates of the center C of the wafer with respect to the optical axis of the micro camera 41 of the wafer chuck 4A can be obtained.

Further, the length of the line connecting the points E1 and E3 (or the points E2 and E4) corresponds to a diameter of the wafer W. Even when the wafer W has a diameter of, e.g., 300 mm, the actual diameter of the wafer W may be slightly different. In order to obtain a precise map (the coordinates of the electrode pads) of the chips on the wafer W, the coordinates of the center of the wafer W and the diameter of the wafer W need to be calculated. Moreover, one more reason for obtaining the coordinates of the center of the wafer W is because the registered positions of the electrode pads of the chips on the coordinates so-called ideal coordinates on the wafer are stored as relative positions with respect to the coordinates of the center of the wafer W.

Figure 18A:
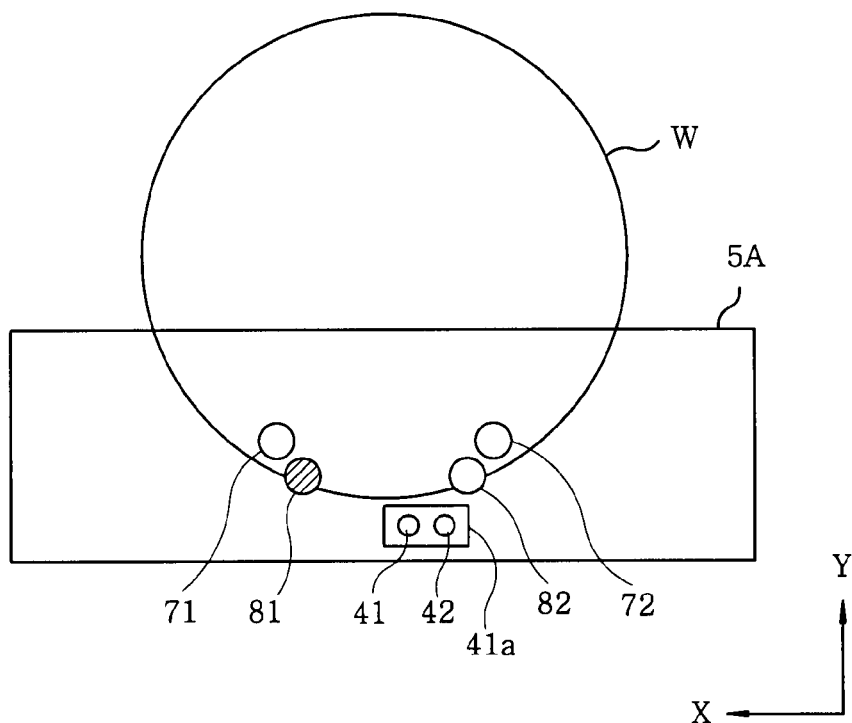
FIGS. 18A and 18B explain a method of using the micro camera of the alignment bridge.
Figure 18B:
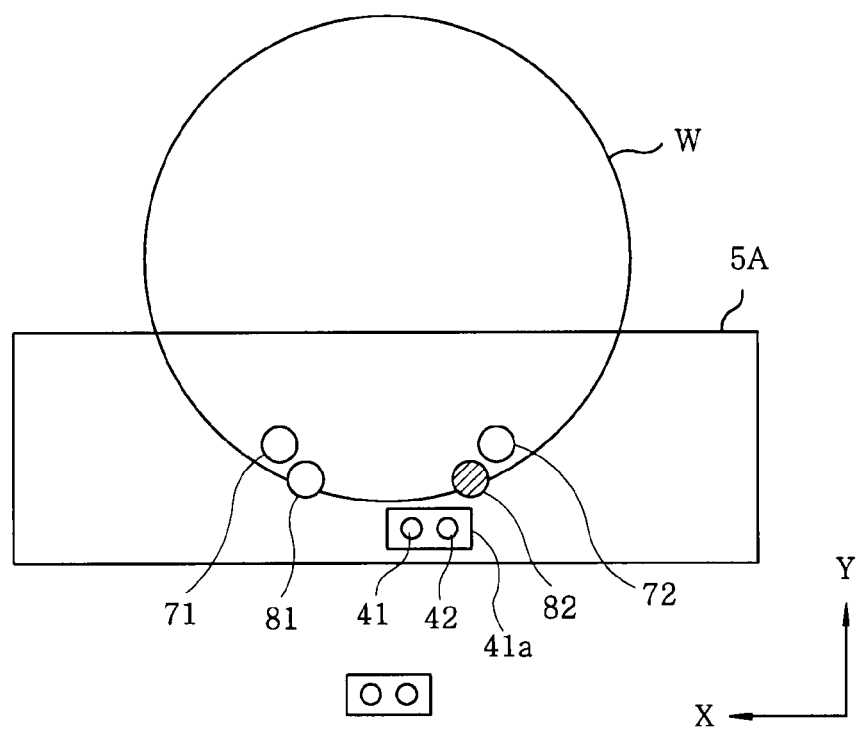
Figure 19A:
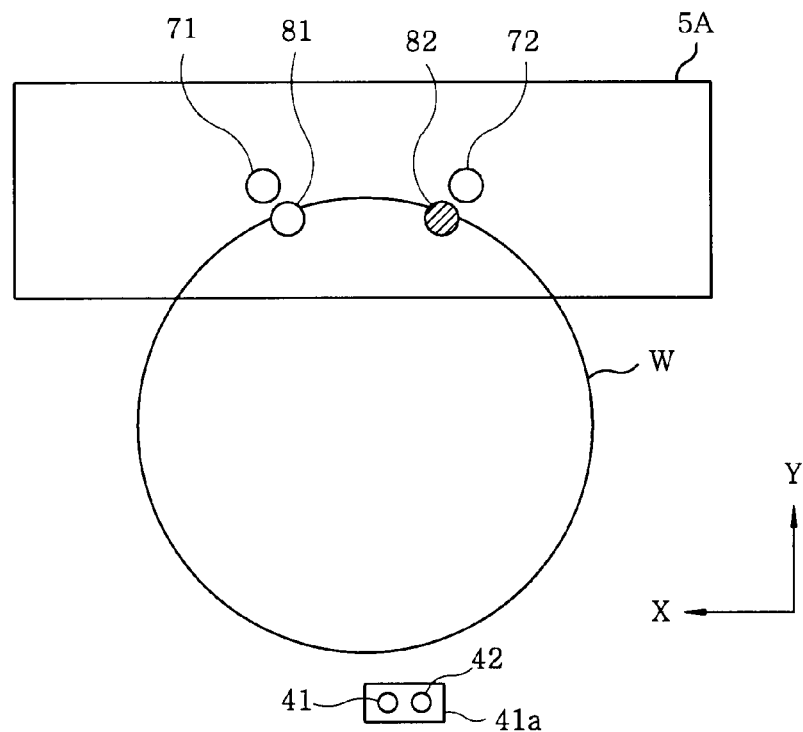
FIGS. 19A and 19B explain a method of using the micro camera of the alignment bridge.
Figure 19B:
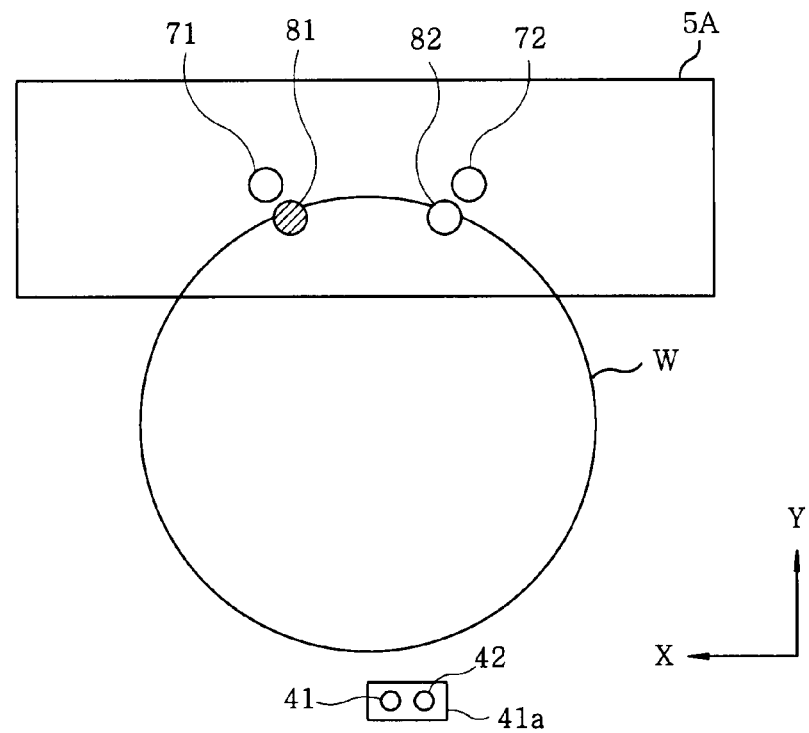

In this example, as can be seen from FIGS. 18A and 18B, images of lower left and right portions of the wafer W shown in FIGS. 18A and 18B are sequentially taken by the macro cameras 81 and 82, thereby obtaining the positions of the points E2 and E3. Thereafter, as illustrated in FIGS. 19A and 19B, the wafer W is moved in the Y direction and, then, images of upper right and left portions of the wafer W shown in FIGS. 19A and 19B are sequentially taken by the macro cameras 81 and 82. As a result, the positions of the points E1 and E4 are obtained.

Figure 20:
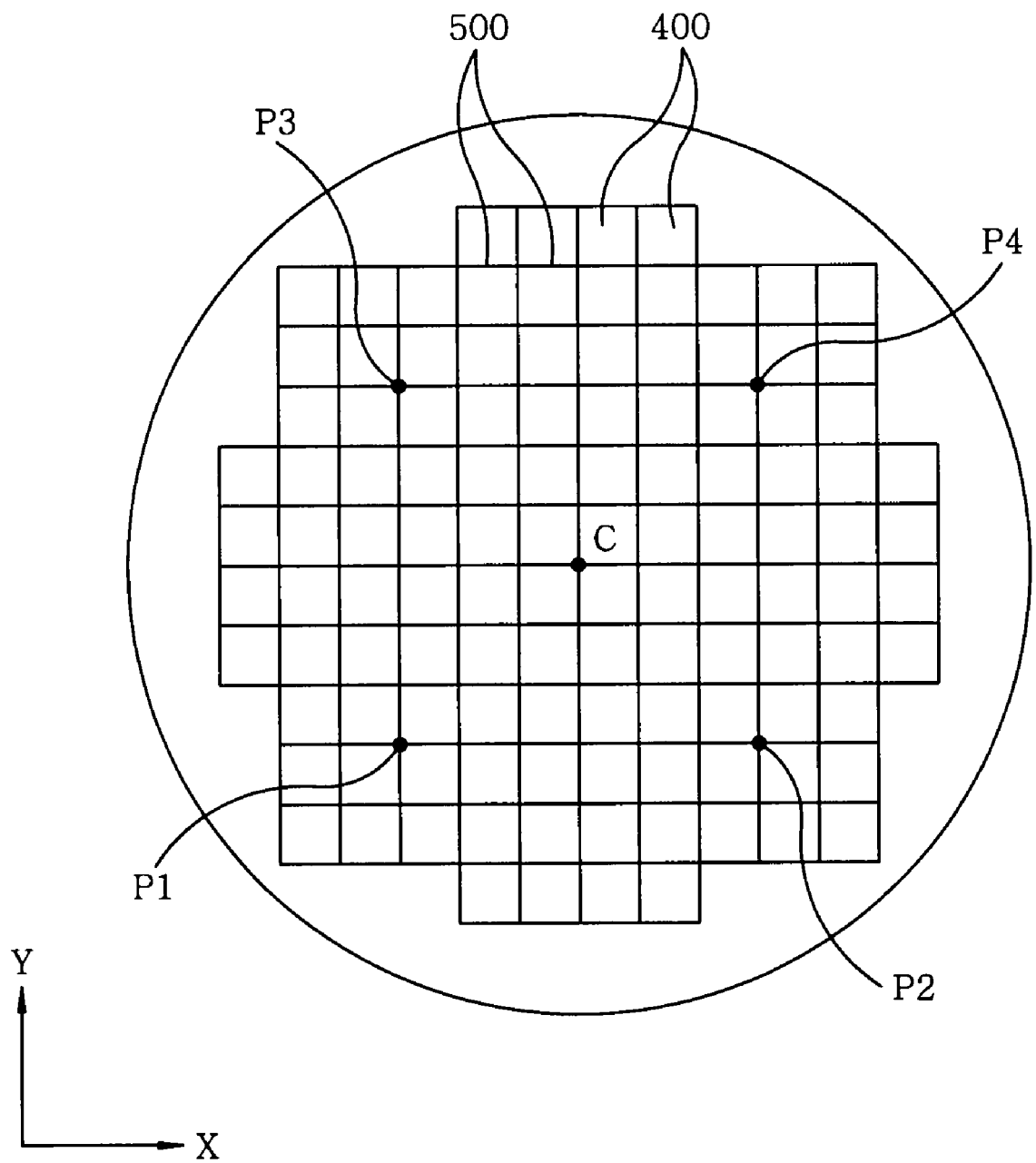
FIG. 20 illustrates an example of arrangement of IC chips on the wafer W.

Thereafter, the orientation of the wafer W is adjusted so that the IC chips on the wafer W (dicing lines between the chips on the substrate) are arranged along the X axis and the Y axis. Since the orientation of the wafer W is pre-aligned before the wafer W is mounted on the wafer chuck 4A, the arrangement direction of the IC chips of the wafer W is substantially in parallel with the Y axis. Even if the orientation is deviated, the deviation angle is about, e.g., 1°. FIG. 20 shows an example of the arrangement of the IC chips on the wafer W. Reference numeral 400 indicates the IC chips, and reference numeral 500 represent dicing lines.

Figure 21A:
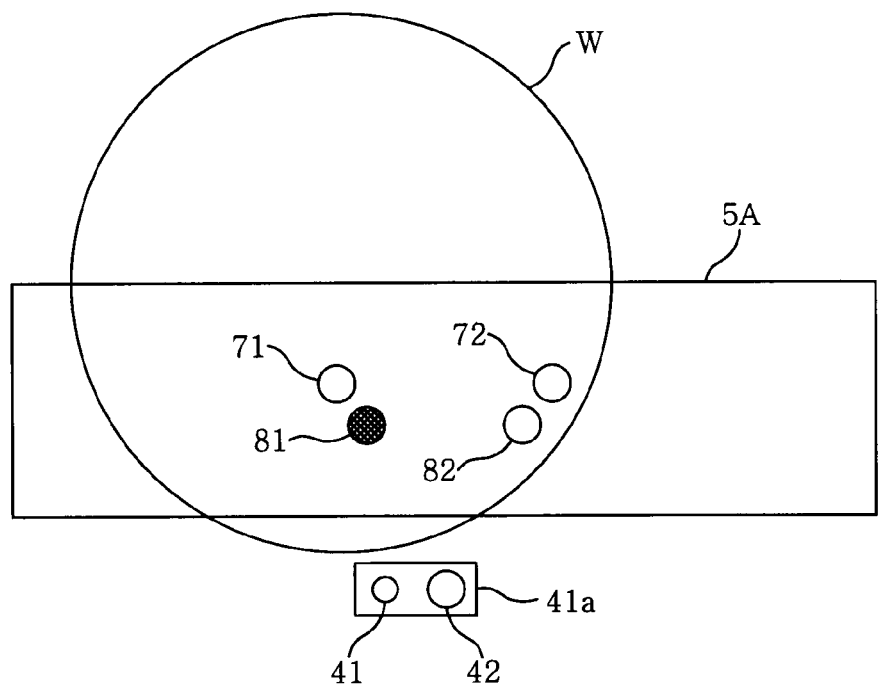
FIGS. 21A and 21B provide first diagrams for explaining wafer orientation adjustment.

First of all, as shown in FIG. 21A, corners of the IC chips are imaged by the macro camera 81 and, then, the approximate orientation of the wafer W is obtained from the imaging result. Then, specific points P1 and P2 arranged along the X axis among the predetermined four specific points P1 to P4 are imaged by the micro cameras 71 and 72, respectively. The specific points P1 to P4 correspond to the corners of the IC chip 400. If the specific points P1 and P2 are completely in parallel with the X axis, the specific points P1 and P2 can be respectively positioned on the centers of view fields of the micro cameras 71 and 72 by aligning X and Y coordinates of the specific points P1 and P2 calculated based on the design value with the positions of the optical axes of the micro cameras 71 and 72. However, such a case is extremely rare, and the orientation of the wafer W is slightly deviated from the predetermined orientation. That is, the horizontal and the vertical dicing lines 500 are deviated from the X and the Y axis. Therefore, when the wafer W is moved to the designed position, the specific points P1 and P2 may not exist within the view of the micro cameras 71 and 72.

Figure 21B:
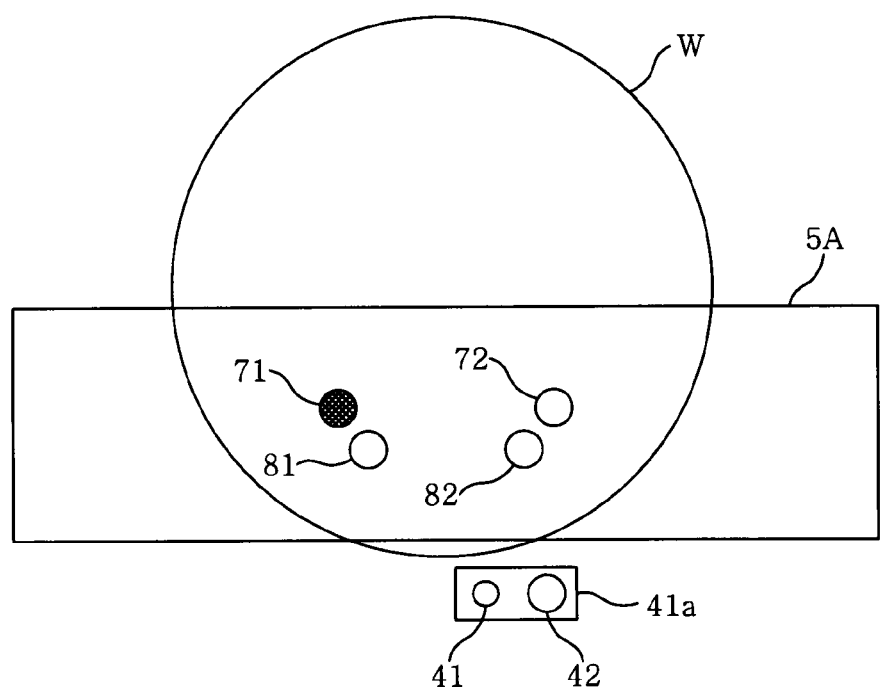
Figure 22A:
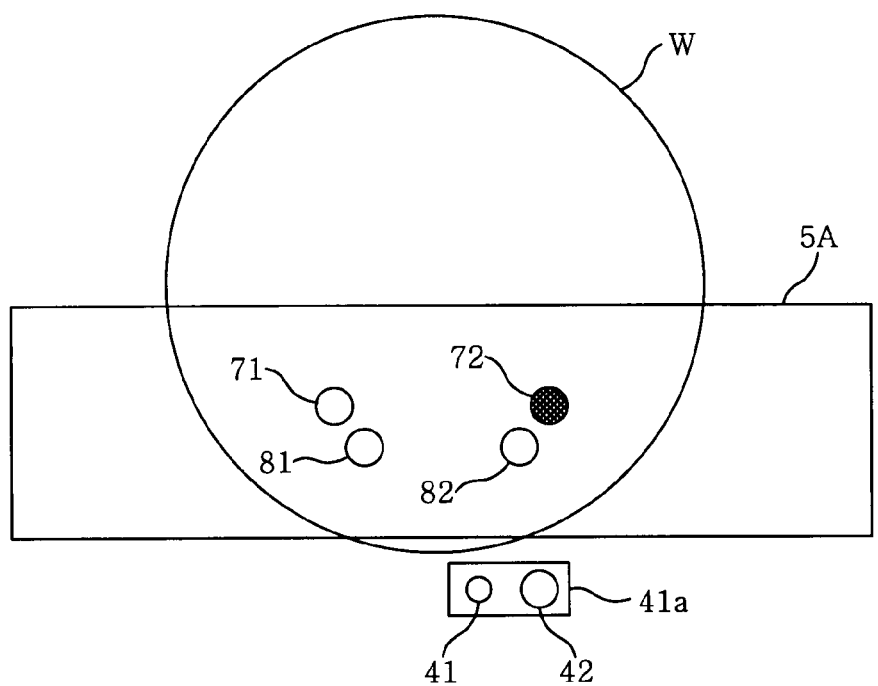
FIGS. 22A and 22B present second diagrams for explaining the wafer orientation adjustment.
Figure 22B:
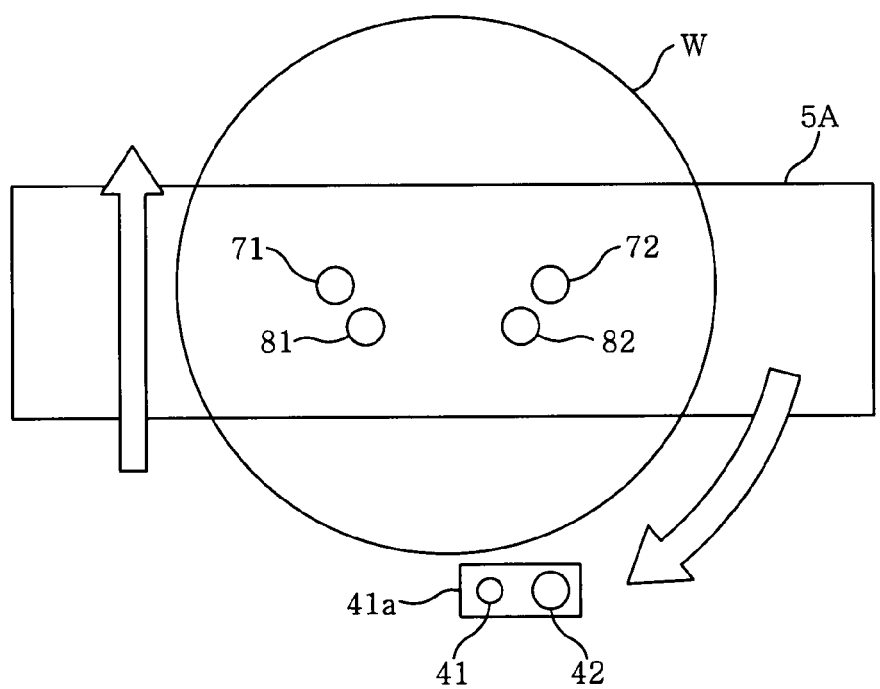

Therefore, the approximate orientation of the wafer W is calculated based on the imaging result of the macro camera 81. Based on the calculation result, the wafer chuck 4A is driven so that the specific points P1 and P2 are sequentially positioned within the view fields of the micro cameras 71 and 72. The specific points P1 and P2 are sequentially imaged by the micro cameras 71 and 72 (the specific points P1 and P2 are positioned at the center of the view fields). FIGS. 21B and 22A show these steps. Based on the imaging result, the deviation amount of the orientation of the wafer W can be calculated, so that the direction of the wafer W is corrected (FIG. 22B) by rotating the wafer chuck 4A by as much as the deviation amount. As a result, the vertical and the horizontal dicing lines 500 of the wafer W become parallel with the X and the Y axis, respectively.

Figure 23A:
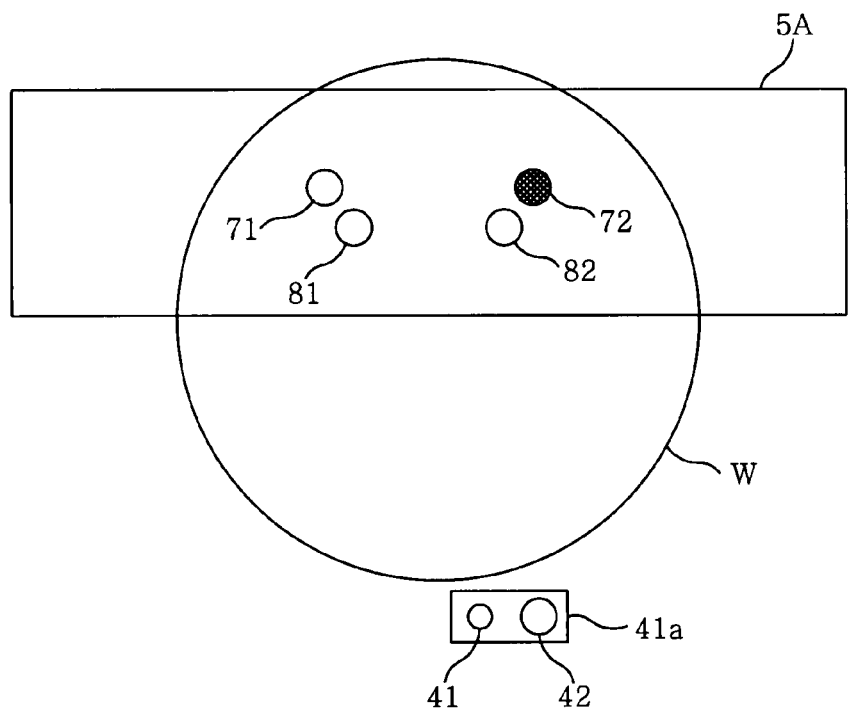
FIGS. 23A and 23B represent third diagrams for explaining the wafer orientation adjustment.
Figure 23B:
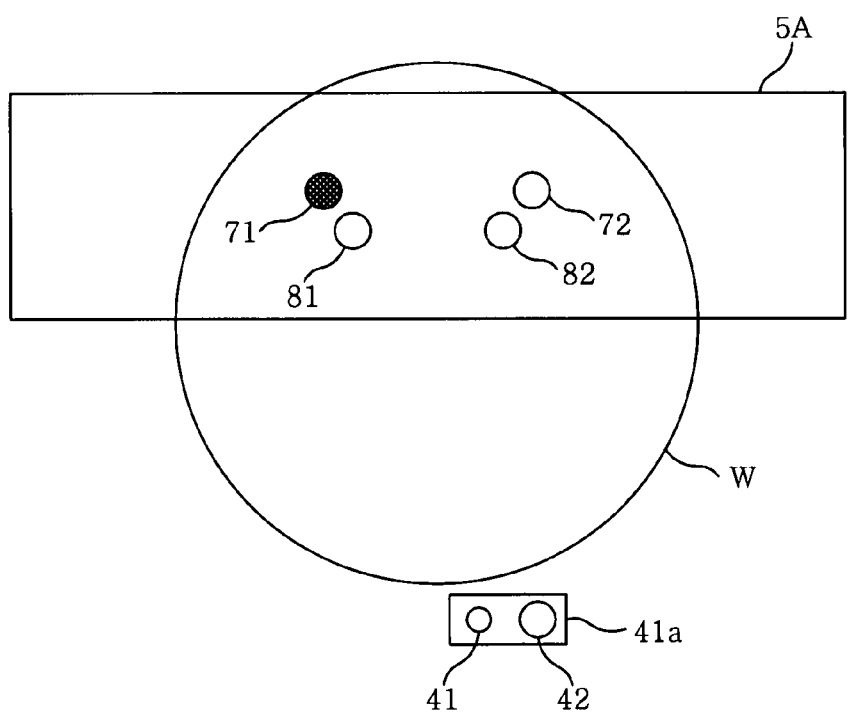

Thereafter, in order to check the correction of the direction of the wafer W, the specific points P3 and P4 are imaged sequentially by the micro camera 71 and 72, as illustrated in FIGS. 23A and 23B. When the direction of the wafer W is aligned with a predetermined orientation, the X, Y and Z coordinates of the wafer chuck 4A (contact position) at which the probe needles 29 contact with the wafer W3 are calculated. Meanwhile, when the direction of the wafer W is not aligned with the predetermined orientation, the orientation of the wafer W is corrected again. Then, the direction of the wafer W is checked by taking images of the specific points P1 and P2 by the micro cameras 71 and 72 again.

Based on the position of the wafer chuck 4A at which the imaging has been performed and the position of the wafer chuck 4A at which the original position has been regained, the control unit 15 can calculate coordinates of the wafer chuck 4A at which the probe needles 29 of the probe card 6A contact with the electrodes pads on the wafer W3. By moving the wafer chuck 4A to the calculated contact position, the probe needles 29 of the probe card 6A are brought into contact with the electrode pads on the wafer W3 at a time. Further, a predetermined electrical signal is transmitted from the test head (not shown) to the electrode pads of the IC chips on the wafer W3 via the pogo pin unit 28 and the probe card 6A, thereby testing electrical characteristics of the IC chips. Thereafter, as the case of the wafer W1, the wafer W3 is unloaded from the wafer chuck 4B by the wafer transfer mechanism 3 after moving the wafer chuck 4B to the transfer position. In the same manner, the wafer W4 loaded into the second inspection unit 21B is inspected.

In the present embodiment, when the apparatus is assembled, the coordinates of the rotational center of the wafer chuck 4A (X and Y coordinates on the stage) are obtained by the flowing method and stored as machine parameters. First of all, a reference wafer is mounted on the chuck, and reference patterns of at least three points in the peripheral portion of the wafer and the position coordinates thereof are stored. Thereafter, the wafer chuck 4A is made to rotate only at a predetermined angle, checking the positions of the reference patterns and storing the position coordinates thereof. Further, the coordinates of each reference pattern obtained before the rotation of the wafer chuck 4A and those obtained after the rotation of the wafer chuck 4A are connected by a straight line. Next, perpendicular bisectors are drawn, and the intersection point thereof is stored as the rotation center. During the alignment, the central position of the wafer W and the coordinates of the alignment target position after rotation can be obtained by following equations. Namely, the coordinates $(X2, Y2)$ obtained after rotating the coordinates $(X1, Y1)$ at an angle of $\theta$ in a clockwise direction while setting the origin as the rotation center can be calculated as follows: $X2 = X1 \times \cos\theta + Y1 \times \sin\theta$; $Y2 = -X1 \times \sin\theta + Y1 \times \cos\theta$.

The following is description of advantages obtained by providing the two micro cameras 71 and 72 and the two macro cameras 81 and 82 at the alignment bridge 5A. In order to calculate the central position of the wafer W, the four points on the peripheral portion of the wafer W, i.e., a pair of the points E2 and E3 and a pair of E1 and E4, can be substantially simultaneously imaged simply by switching the macro cameras 81 and 82. Further, the wafer chuck 4A needs to move only once in the Y direction after checking the points E2 and E3. Meanwhile, in case a single macro camera is provided, the chuck needs to move to the positions corresponding to the four points on the wafer W sequentially. Accordingly, when the two macro cameras 81 and 82 are used, the four points on the periphery of the wafer W can be imaged in a short period of time.

Figure 24A:
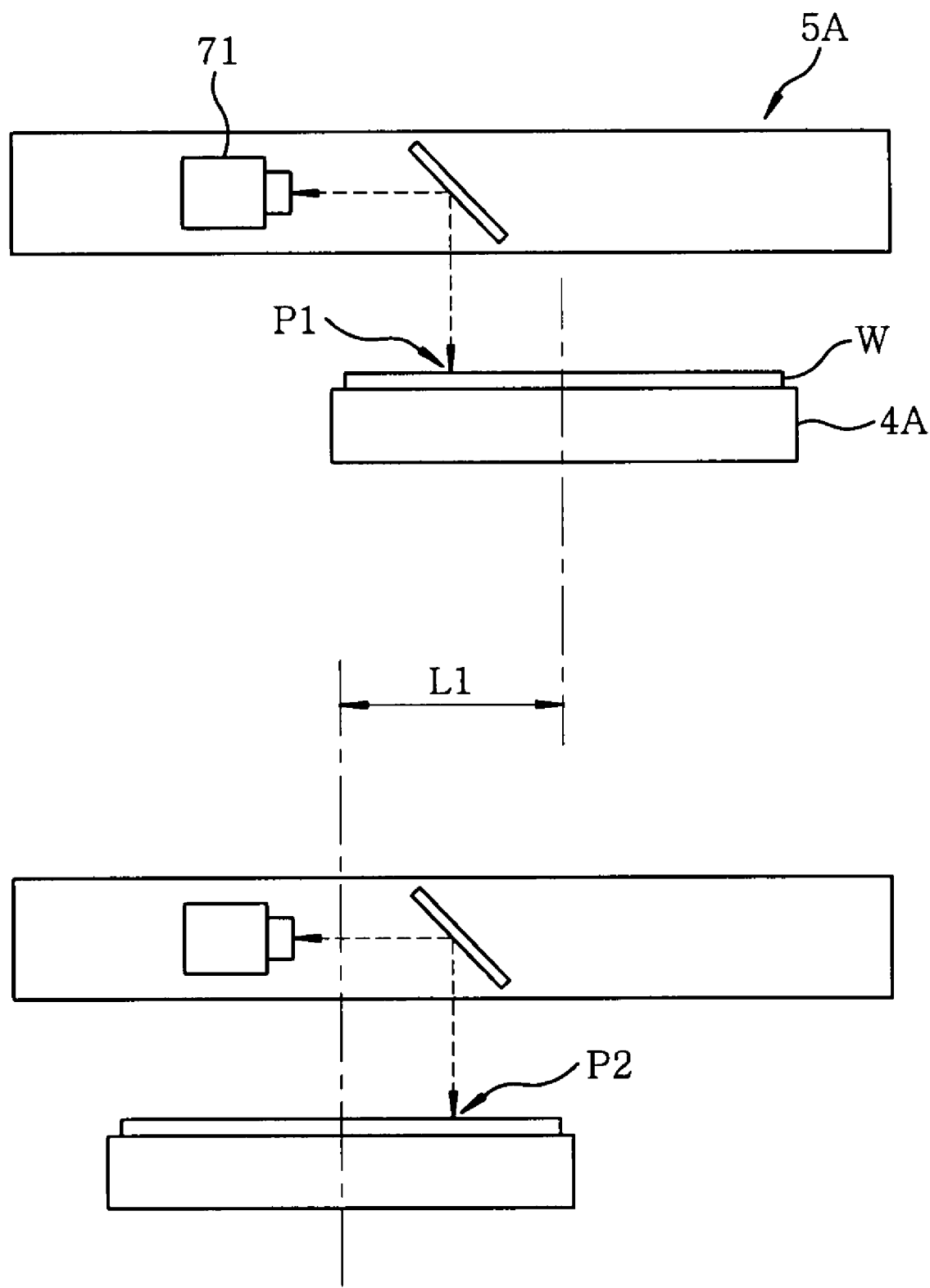
FIGS. 24A and 24B explain a difference in a moving distance of the wafer chuck between when using the alignment bridge of the embodiment of the present invention and when using a conventional alignment bridge.
Figure 24B:
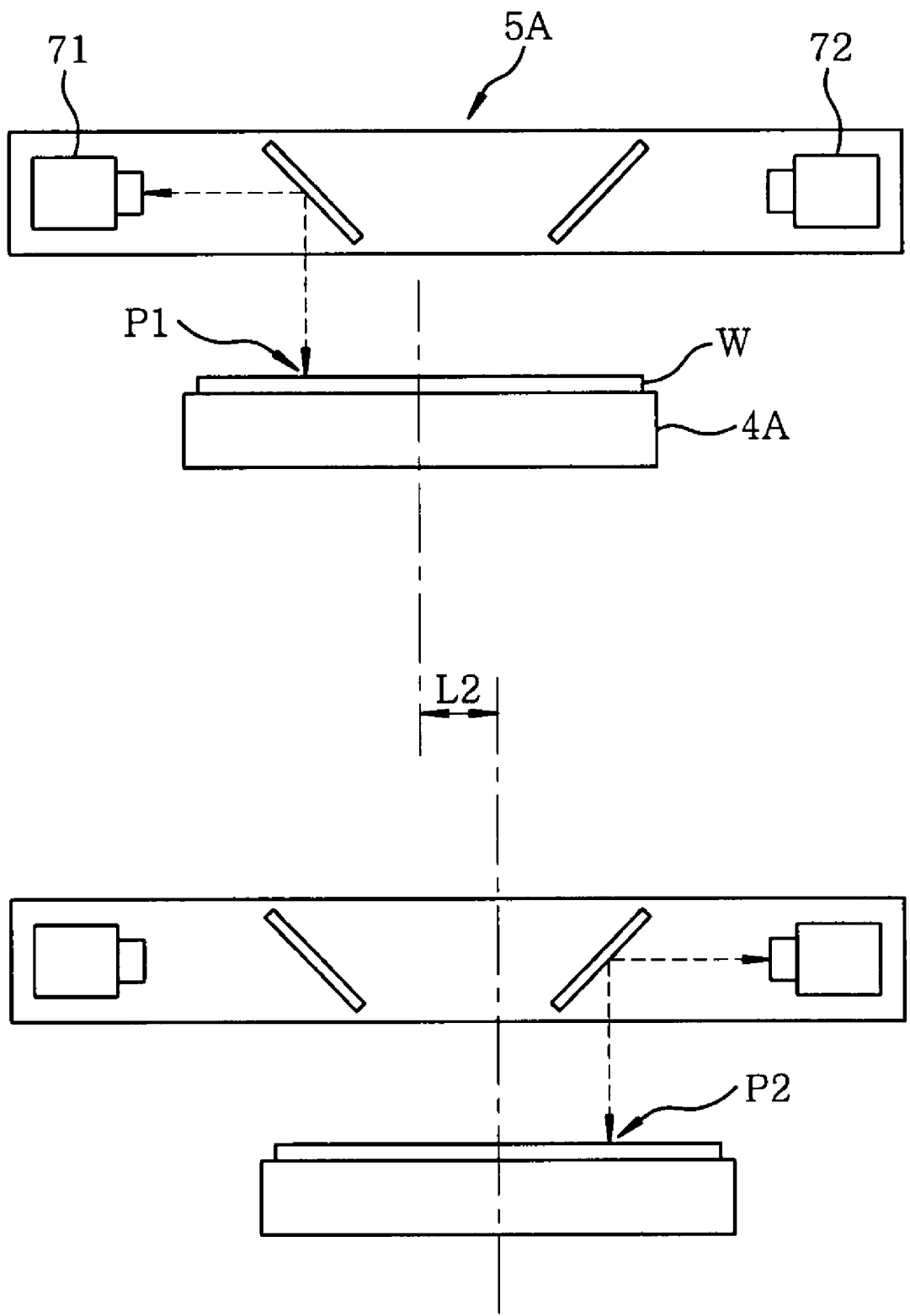

FIG. 24A shows a case where the points P1 and P2 on the wafer W are imaged by a single micro camera 71 mounted on the alignment bridge 5A with an optical axis thereof positioned on the center of the alignment bridge 5A. FIG. 24B shows a case where the points P1 and P2 on the wafer W are imaged in accordance with the above embodiment. As can be seen from FIGS. 24A and 24B, the movement distance of the wafer chuck 4A is L1 in the case of using the single micro camera, but is greatly reduced to L2 in the case of using the two micro cameras.

Figure 25:
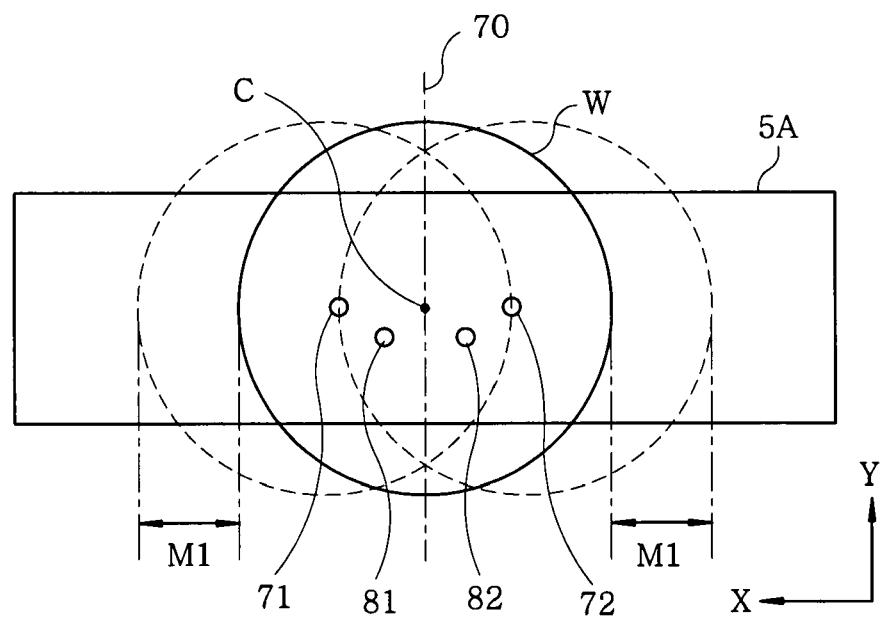
FIG. 25 explains an entire moving amount of a wafer W in an X direction in case of using the alignment bridge.

In order to align the wafer W with the probe needles 29, the alignment marks positioned at both end portions of the wafer W are checked by the micro cameras 71 and 72, or the needle traces on the wafer W are checked after the inspection. To do so, both end portions of the wafer W or points in the vicinity thereof need to be positioned directly under the micro cameras 71 and 72. FIG. 25 depicts a movement of the wafer chuck 4A during the above operation. As can be seen from FIG. 25, the wafer W is positioned under the alignment bridge 5A so that the central line 70 of the alignment bridge 5A passes the center C of the wafer W. In order to image the left region of the wafer W by the micro camera 71, the wafer chuck 4A needs to move in the X direction so that the left end portion of the wafer W can be positioned directly under the micro camera 71. At this time, the moving amount of the wafer chuck 4A in FIG. 25 corresponds to M1. If the wafer W has a diameter of about 300 mm, M1 is about 77 mm.

As shown in FIG. 25, in a state where the center C of the wafer W is positioned on the central line 70 of the alignment bridge 5A, the moving amount of the wafer W to the right or the left area corresponds to M1. Since the wafer W having a diameter of about 300 mm is used in this example, M1 is about 77 mm, and the entire moving amount of the wafer W is about 154 mm.

Figure 26:
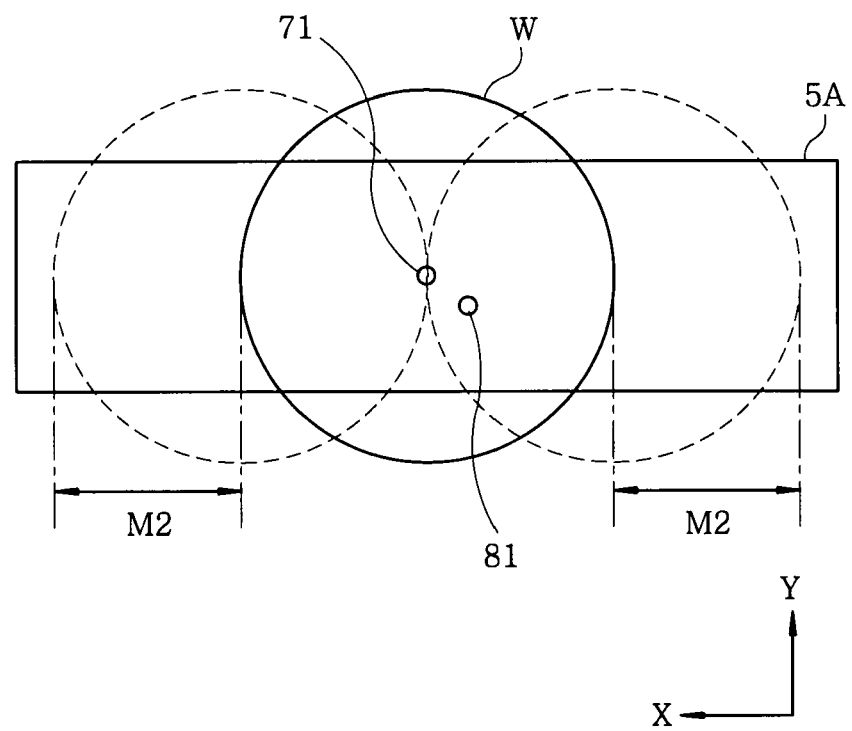
FIG. 26 explains an entire moving amount of the wafer W in the X direction in case of using an alignment bridge to which a single micro camera is attached.

FIG. 26 shows a case where a single micro camera 71 is attached to the alignment bridge 5A. In that case, after the center of the wafer W is positioned directly under the micro camera 71, left or right end portion of the wafer W is positioned directly under the micro camera 71 by moving the wafer chuck 4A in the X direction. Therefore, the moving amount M2 of the wafer W to the right or the left area corresponds to a radius of the wafer W, as depicted in FIG. 26. Since the wafer W having a diameter of 300 mm is used in this example, M2 is about 150 mm, and the entire moving amount of the wafer W is about 300 mm.

From the above, it is expected that the moving amount of the wafer W is reduced by installing the two micro cameras 71 and 72 and the two macro cameras 81 and 82 at the alignment bridge 5A.

When the two macro cameras 81 and 82 are used, they are preferably provided to be symmetrical with respect to the central line 70. This is because when imaging the right and the left region of the wafer W is assigned to the macro cameras 81 and 82, the movement region of the wafer chuck 4A becomes symmetric with respect to the central line 70. Therefore, if this movement region is overlapped with the movement region in which the wafer W is imaged by the micro cameras 71 and 72, the movement region of the wafer chuck 4A is reduced compared to that obtained when they are asymmetric. The arrangement of the macro cameras 81 and 82 may be asymmetric with respect to the central line 70.

The fine alignment operation of the above apparatus is explained based on the operation of the first inspection unit 21A in FIG. 1. The same fine alignment operation is also performed in the second inspection unit 21B. In addition, a series of operations including the fine alignment is carried out by the program 152 in the control unit 15.

In accordance with the above embodiment, following effects can be obtained. The alignment bridges 5A and 5B as moving bodies capable of moving in a horizontal direction at the height positions between the wafer chucks 4A and 4B and the probe cards 6A and 6B are provided with the two micro cameras 71 and 72 and the two macro cameras 81 and 82 which have a downward view to image the wafer. Further, the optical axes of the micro cameras 71 and 72 are spaced from each other, and those of the macro cameras 81 and 82 are also spaced from each other. Therefore, when the image of the wafer W is taken in order to obtain position information of the wafer W, the moving amount of the wafer chucks 4A and 4B can be reduced. Accordingly, the apparatus can be scaled down, and a period of time required for obtaining the position information of the wafer W can be reduced. As a result, a high throughput can be obtained.

Figure 27:
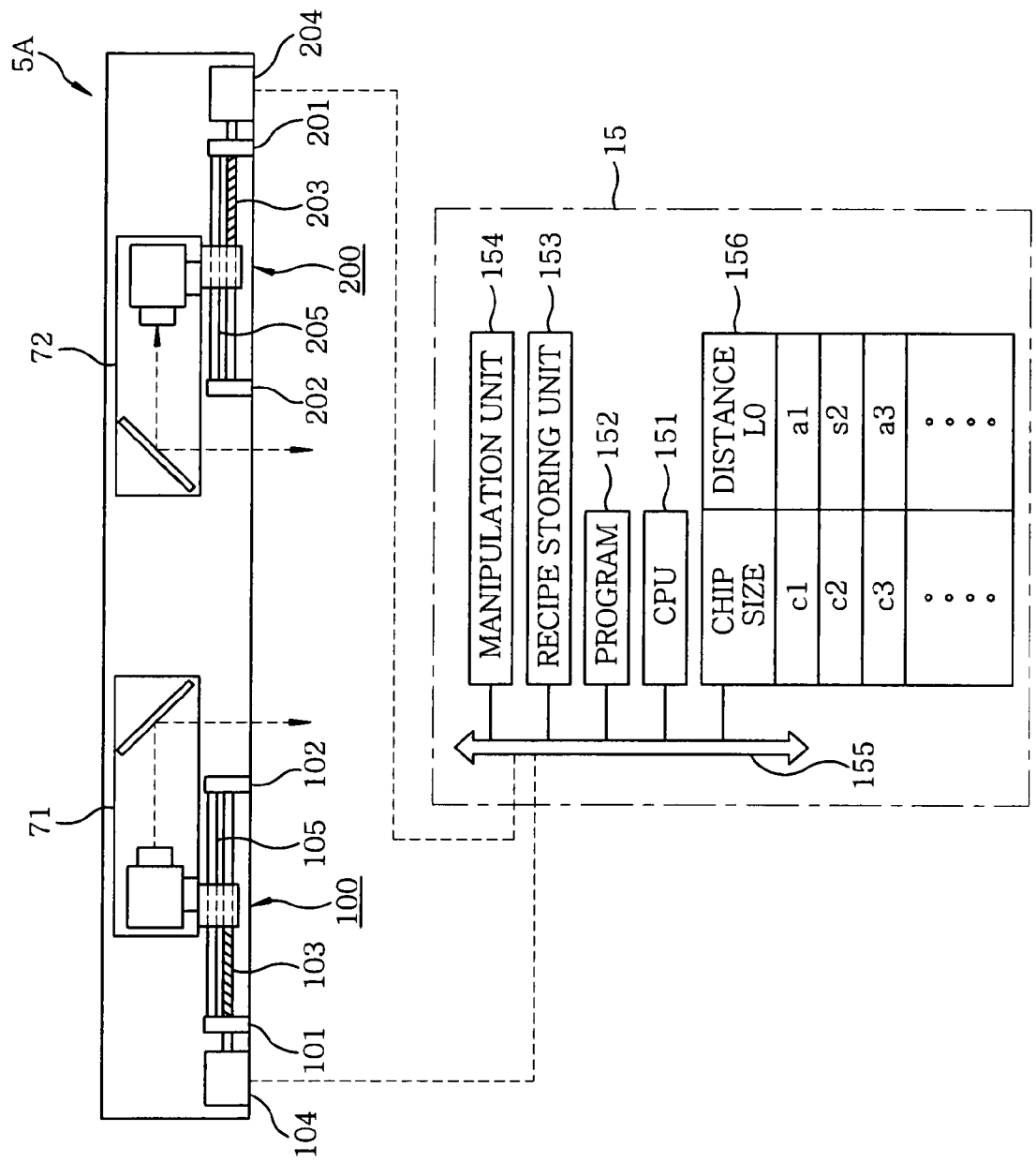
FIG. 27 illustrates the alignment bridge and the control unit in accordance with another embodiment of the present invention.

Hereinafter, another embodiment of the present invention will be described. FIG. 27 shows the alignment bridge 5A and the control unit 15 in accordance with this embodiment. Since the alignment bridge 5B has the same configuration as that of the alignment bridge 5A, the alignment bridge 5A will be described representatively.

In the alignment bridge 5A of this embodiment, the two micro cameras 71 and 72 are made movable, so that they can be approached to and spaced from each other. Further, the alignment bridge 5A is provided with driving units 100 and 200 for moving the respective micro cameras 71 and 72. The driving unit 100 has a ball screw 103 and a guide axis 105 both of which end portions are supported by supporting members 101 and 102. The ball screw 103 and the guide axis 105 are arranged in parallel with respect to the moving direction of the micro camera 71. Moreover, a driving motor 104 for rotating the ball screw is connected to one end portion of the ball screw 103, i.e., a back side of the micro camera 71. By rotating the ball screw 103 with the driving motor 104, the micro camera 71 is moved while being supported by the guide axis 105. Since the driving unit 200 has the same configuration as that of the driving unit 100, the redundant description will be omitted.

The driving motors 104 and 204 are connected to the control unit 15 and thus are driven by the control unit 15. The control unit 15 is provided with a camera moving table 156 in addition to the CPU 151, the program 152, the recipe storing unit 153 and the manipulation unit 154, which are connected to each other via the bus 155. The camera moving table 156 presents correlation data between information on sizes of the IC chips 400 and the distance between the micro cameras 71 and 72, and the driving motors 104 and 204 are driven based on the data of the camera moving table 156.

In the aforementioned embodiment, the positions of the two micro cameras 71 and 72 are fixed, so that the distance between the points P1 and P2 in the X direction is not equal to the distance between the micro cameras (in most cases). Therefore, in order to image the point P2 after taking the image of the point P1, the wafer chuck 4A needs to be slightly moved. Therefore, by providing the micro cameras 71 and 72 which are movable toward and away from each other, the distance between the micro cameras can be adjusted to be equal to that between the points P1 and P2 (P3 and P4). The points P1 and P2 (P3 and P4) are located at corners of the IC chip 400, so that the distance between the points P1 and P2 (P3 and P4) is determined by the size of the IC chip 400.

Figure 28:
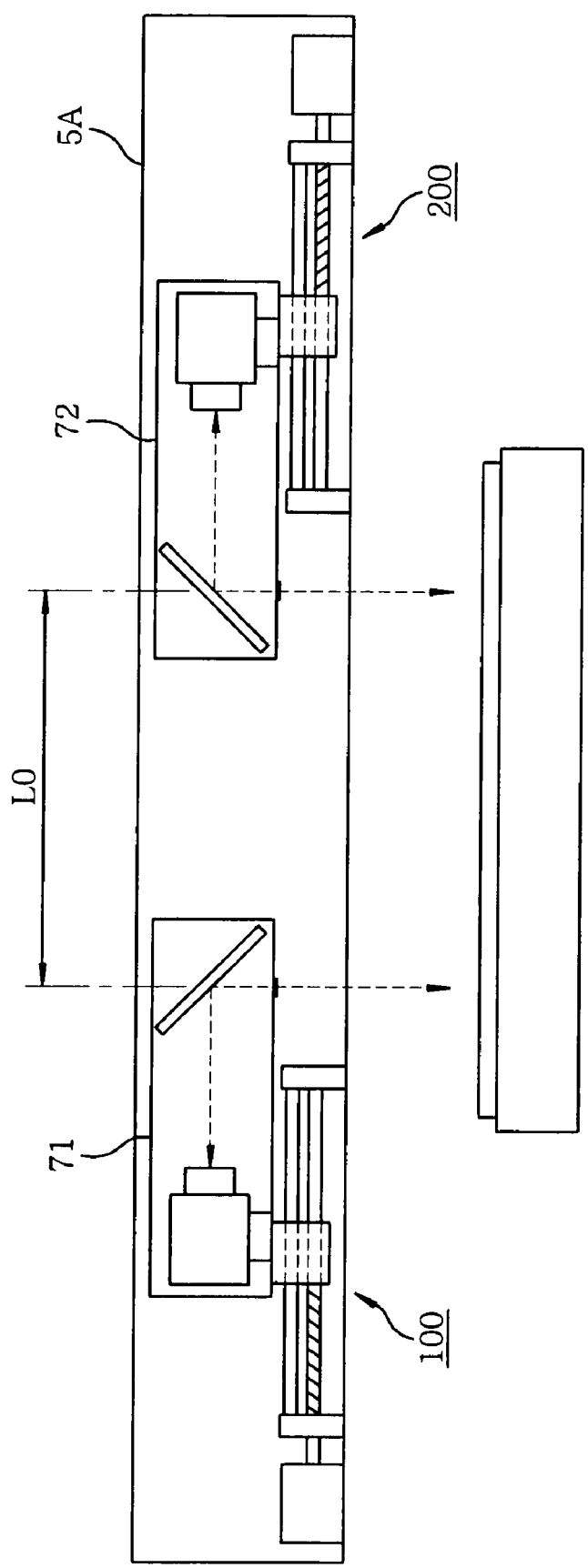
FIG. 28 explains an operation of adjusting a distance between the micro cameras.

The camera moving table 156 is stored in a memory by the control unit 15 and the information corresponding to the chip size is inputted by the input unit in the wafer inspection step. Next, the distance between the micro cameras 71 and 72 which corresponds to the input chip size is read out from the camera moving table 156, and the micro cameras 71 and 72 are moved by controlling the driving unit to be separated from each other by the distance. Next, the driving motor 104 stops at the moment the distance between the micro cameras 71 and 72 becomes L0. Accordingly, in the alignment bridge 5A of the present embodiment, the distance between the micro cameras 71 and 72 can be adjusted to the distance L0 determined according to the size of the IC chip 400 of the wafer to be imaged by moving the micro cameras 71 and 72 as can be seen in FIG. 28.

In accordance with this embodiment, following effects can be obtained. Since the micro cameras 71 and 72 for imaging the wafer are made movable toward and away from each other, the distance therebetween can be adjusted to be made same as the distance between two specific points on the wafer W, e.g., the points P1 and P2 (or P3 and P4) shown in FIG. 2. Therefore, when the wafer chuck 4A or 4B is moved to the position at which one point P1 (or P3) is imaged, it is possible to image the other point P2 (or P4) without moving the wafer chuck 4A or 4B. As a result, a higher throughput can be achieved.

The above-described probe card 5A can be used: when the contact of the wafer with the probe needles is made at a time; when the wafer W contacts in two steps with the probe needles 29 corresponding to the electrode pads disposed in two half-regions of the wafer W; and when the wafer W sequentially contacts in four steps with the probe needles 29 corresponding to the electrode pads disposed in circumferentially divided four regions circumferential direction of the wafer W. In this case, the probe needles 29 are made to contact with the wafer W simply by rotating the wafer chuck 4A. Preferably, the probe apparatus of the present invention is applied to the configuration in which the inspection of the wafer W is completed by performing the contact operation one to four times.

The micro cameras 71 and 72 may have magnification converters provided on the optical path of the optical system. By controlling the magnification converters, it is possible to obtain a view field (middle view field) of slightly smaller magnification than the magnification when they are used as the high magnification camera. The magnification of the micro camera when it is used as the high magnification camera enables needle traces on the electrode pads to be checked. When the operator needs to check the needle traces on the electrode pad after the inspection, the needle traces cannot be seen by the macro cameras 81 and 82.

Moreover, the electrode pads can be checked only one by one by the micro cameras 71 and 72, requiring a long period of time. Accordingly, a plurality of electrode pads can be monitored at a time by using the middle view field, and the existence/non-existence of the needle traces can be effectively checked. Such a middle view field can also be used for imaging the specific points for alignment on the wafer W.

As set forth above, the distance between the optical axis of the first micro camera 71 and that of the second micro camera 72 is about 146 mm in the example, which is close to the radius of the wafer, i.e., 150 mm. By setting the distance between the optical axes close to the radius of the wafer, it is possible to minimize the moving amount of the stage (wafer chuck) which is required to have the entire surface of the wafer W within the view fields of the micro cameras 71 and 72.

The substrate transfer arm is not limited to the above exemplified one having three arms, and may have a single arm. In addition, the pre-alignment mechanism is not necessarily combined with the substrate transfer arm, and may be installed at the apparatus separately from the substrate transfer arm. In that case, the wafer is transferred to the stage of the pre-alignment mechanism from the substrate transfer arm so that the orientation of the wafer is adjusted to a predetermined orientation and, at the same time, the wafer is transferred from the stage to the substrate transfer arm so that the center of the wafer is positioned at a predetermined portion of the substrate transfer arm. The probe apparatus to which the present invention is applied may have a single apparatus main body or three ore more apparatus main bodies with a common loading port provided thereto.

While the invention has been shown and described with respect to the embodiments, it will be understood by those skilled in the art that various changes and modification may be made without departing from the scope of the invention as defined in the following claims.

What is claimed is:

1. A probe apparatus for inspecting a plurality of chips arranged on a wafer, by contacting probes of a probe card with electrode pads of the chips while mounting on a mounting table the wafer, the mounting table being horizontally and vertically movable by a mounting table driving unit, the probe apparatus comprising:
    an imaging unit provided at the mounting table and having an upward view to image the probes;
    a moving body movable horizontally at a height position within a range between the mounting table and the probe card;
    a first and a second imaging unit of which optical axes are spaced from each other, provided at the moving body and having a downward view to take an image of a surface of the wafer; and
    a control unit obtaining respective positions of the mounting table at which a focus of the imaging unit for imaging the probes and a focus of the first imaging unit for imaging the wafer are made to coincide with each other and then the focus of the imaging unit for imaging the probes and the second imaging unit for imaging the wafer are made to coincide with each other by moving the mounting table;
    obtaining respective positions of the mounting table at which the images of the wafer on the mounting table are sequentially taken by the first and the second imaging unit for imaging the wafer by moving the mounting table;
    obtaining a position of the mounting table at which the image of the probes is taken by the imaging unit for imaging the probes; and
    calculating a position of the mounting table at which the wafer contacts with the probes based on the obtained positions of the mounting table.

2. The probe apparatus of claim 1, further comprising a first and a second low magnification camera of which optical axes are spaced from each other, provided at the moving body and having a downward view to image the wafer at a magnification lower than those of the first and the second imaging unit.

3. The probe apparatus of claim 1, wherein a pair of the first imaging unit and the first low magnification camera and a pair of the second imaging unit and the second low magnification camera are arranged symmetrically.

4. The probe apparatus of claim 1, wherein two points on a peripheral portion of the wafer are sequentially imaged by the first and the second low magnification camera; after the mounting table is moved in a direction perpendicular to a line connecting the optical axes of the first and the second low magnification camera, other two points on an opposite peripheral portion of the wafer are sequentially imaged by the first and the second low magnification camera; and a central position of the wafer is obtained based on the positions of the mounting table at which the four points of the wafer are imaged.

5. The probe apparatus of claim 4, wherein the two points on the peripheral portion of the wafer mounted on the mounting table and the other two points on the opposite peripheral portion are imaged by the first and the second imaging unit for imaging the wafer instead of the first and the second low magnification camera for imaging the wafer.

6. The probe apparatus of claim 1, wherein the mounting table is rotated to make the wafer positioned in a predetermined direction based on positions of the mounting table at which two specific points spaced from each other on the wafer are sequentially imaged by the first and the second imaging unit for imaging the wafer.

7. The probe apparatus of claim 1, wherein the first and the second imaging unit for imaging the wafer are provided at the moving body such that they are movable toward and away from each other by a driving unit for the imaging unit.

8. The probe apparatus of claim 1, wherein the control unit outputs a control signal to the driving unit for the imaging unit so that a distance between the optical axes of the first and the second imaging unit becomes equal to a distance between the two specific points on the wafer based on information corresponding to the type of the wafer.

9. A probing method for inspecting a plurality of chips arranged on a wafer, by contacting probes of a probe card with electrode pads of the chips while mounting on a mounting table the wafer, the mounting table being horizontally and vertically movable by a mounting table driving unit, the probing method comprising:
by using an imaging unit provided at the mounting table and having an upward view to image the probes and a first and a second imaging unit of which optical axes are spaced from each other, provided at a moving body moving horizontally at a height position within a range between the mounting table and the probe card and having a downward view to image a surface of the wafer,
obtaining respective positions of the mounting table at which a focus of the imaging unit for imaging the probes and a focus of the first imaging unit for imaging the wafer are made to coincide with each other and then the focus of the imaging unit for imaging the probes and a focus of the second imaging unit for imaging the wafer are made to coincide with each other;
obtaining respective positions of the mounting table at which the images of the wafer on the mounting table are sequentially taken by the first and the second imaging unit for imaging the wafer by moving the mounting table;
obtaining a position of the mounting table at which the image of the probes is taken by the imaging unit for imaging the probes; and
calculating a position of the mounting table for contacting the wafer and the probes based on the obtained positions of the mounting table.

10. The probing method of claim 9, wherein obtaining the positions of the mounting table at which the images of the wafer mounted on the mounting table are sequentially taken by the first and the second imaging unit for imaging the wafer includes: sequentially imaging two points on a peripheral portion of the wafer by the first and the second imaging unit; after moving the mounting table in a direction perpendicular to a line connecting the optical axes of the first and the second imaging unit, sequentially imaging other two points on an opposite peripheral portion of the wafer by the first and the second imaging unit; and obtaining a central position of the wafer based on the positions of the mounting table at which the four points of the wafer are imaged.

11. The probing method of claim 9, further comprising: rotating the mounting table to make the wafer positioned in a predetermined direction based on positions of the mounting table at which two specific points spaced from each other on the wafer are sequentially imaged by the first and the second imaging unit for imaging the wafer.

12. The probing method of claim 9, further comprising adjusting the positions of the first and the second imaging unit by a driving unit for the imaging unit so that a distance between the optical axes of the first and the second imaging unit becomes equal to a distance between the two specific points on the wafer based on information corresponding to the type of the wafer.

13. A storage medium storing a computer-executable program used in a probe apparatus for inspecting a plurality of chips arranged on a substrate by mounting the substrate on a mounting table that is horizontally and vertically movable by a mounting table driving unit, and then contacting probes of a probe card with electrode pads of the chips,
wherein the computer program performs the probing method described in claim 9.

* * * * *